US012500120B2

(12) United States Patent
Huang et al.

(10) Patent No.: US 12,500,120 B2
(45) Date of Patent: Dec. 16, 2025

(54) SEMICONDUCTOR DEVICE WITH AIR GAP AND METHOD FOR FABRICATING THE SAME

(71) Applicant: NANYA TECHNOLOGY CORPORATION, New Taipei (TW)

(72) Inventors: Chih-Wei Huang, Taoyuan (TW); Hsu-Cheng Fan, Taoyuan (TW); Chih-Yu Yen, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 369 days.

(21) Appl. No.: 18/207,828

(22) Filed: Jun. 9, 2023

(65) Prior Publication Data

US 2024/0413007 A1    Dec. 12, 2024

(51) Int. Cl.
*H01L 21/768*  (2006.01)
*H01L 23/528*  (2006.01)
*H01L 23/532*  (2006.01)

(52) U.S. Cl.
CPC ...... *H01L 21/7682* (2013.01); *H01L 23/5283* (2013.01); *H01L 23/53257* (2013.01); *H01L 23/5329* (2013.01)

(58) Field of Classification Search
CPC ............. H01L 21/7682; H01L 23/5283; H01L 23/53257; H01L 23/5329; H01L 21/76831; H01L 23/481; H01L 23/528; H10B 12/03; H10B 12/48
See application file for complete search history.

(56) References Cited

U.S. PATENT DOCUMENTS

2009/0101884 A1\*  4/2009  Tu ........................ H10N 70/063
                                                                   438/102
2018/0261601 A1\*  9/2018  Kim ...................... H10B 12/34

FOREIGN PATENT DOCUMENTS

| CN | 104347592 A | 2/2015 |
| CN | 115036312 A | 9/2022 |
| TW | 202230737 A | 8/2022 |

OTHER PUBLICATIONS

Office Action and and the search report mailed on Nov. 29, 2024 related to Taiwanese Application No. 113108691.
Office Action and Search Report mailed on Feb. 21, 2024 related to Taiwanese Application No. 112126016.

\* cited by examiner

*Primary Examiner* — Patricia D Valenzuela
(74) *Attorney, Agent, or Firm* — Xuan Zhang

(57) ABSTRACT

The present application discloses a semiconductor device and a method for fabricating the semiconductor device. The semiconductor device includes a substrate; a drain positioned in the substrate; a top dielectric layer positioned on the substrate; a cell contact structure including a cell contact bottom conductive layer positioned in the top dielectric layer and on the drain, a cell contact top conductive layer positioned in the top dielectric layer and on the cell contact bottom conductive layer, and a cell contact top sealing layer positioned in the top dielectric layer, on the cell contact bottom conductive layer, and surrounding the cell contact top conductive layer; and a first air gap positioned in the top dielectric layer and surrounding the cell contact bottom conductive layer.

20 Claims, 41 Drawing Sheets

SEMICONDUCTOR DEVICE WITH AIR GAP AND METHOD FOR FABRICATING THE SAME

TECHNICAL FIELD

The present disclosure relates to a semiconductor device and a method for fabricating the semiconductor device, and more particularly, to a semiconductor device with an air gap and a method for fabricating the semiconductor device with the air gap.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a drain positioned in the substrate; a top dielectric layer positioned on the substrate; a cell contact structure including a cell contact bottom conductive layer positioned in the top dielectric layer and on the drain, a cell contact top conductive layer positioned in the top dielectric layer and on the cell contact bottom conductive layer, and a cell contact top sealing layer positioned in the top dielectric layer, on the cell contact bottom conductive layer, and surrounding the cell contact top conductive layer; and a first air gap positioned in the top dielectric layer and surrounding the cell contact bottom conductive layer.

Another aspect of the present disclosure provides a semiconductor device including a substrate; a common source and a drain positioned in the substrate and separated from each other by a word line structure; a top dielectric layer positioned on the substrate; a bit line structure positioned in the top dielectric layer and on the common source; a cell contact structure including a cell contact bottom conductive layer positioned in the top dielectric layer and on the drain, a cell contact top conductive layer positioned in the top dielectric layer and on the cell contact bottom conductive layer, and a cell contact top sealing layer positioned in the top dielectric layer, on the cell contact bottom conductive layer, and surrounding the cell contact top conductive layer; a first bit line spacer positioned on a sidewall of the bit line structure and between the cell contact structure and the bit line structure; a third bit line spacer positioned on the first bit line spacer; and a second air gap positioned between the first bit line spacer and the third bit line spacer.

Another aspect of the present disclosure provides a method for fabricating a semiconductor device including providing a substrate and forming a drain in the substrate; forming a top dielectric layer on the substrate and forming an opening along the top dielectric layer to expose the drain; conformally forming a sacrificial layer in the opening; performing a first punch etching process to partially remove the sacrificial layer, resulting in a sacrificial segment on a sidewall of the opening and exposing the drain; forming a cell contact bottom conductive layer on the drain and surrounded by the sacrificial segment; performing a removal process to remove the sacrificial segment and form a space surrounding the cell contact bottom conductive layer; forming a cell contact top sealing layer on the cell contact bottom conductive layer to seal the space, resulting in a first air gap surrounding the cell contact bottom conductive layer; and forming a cell contact top conductive layer on the cell contact bottom conductive layer and surrounded by the cell contact top sealing layer. The cell contact bottom conductive layer, the cell contact top conductive layer, and the cell contact top sealing layer configure a cell contact structure.

Due to the design of the semiconductor device in the present disclosure, the parasitic capacitance between conductive features may be reduced by utilizing the first air gap. This reduction leads to an improvement in the performance of the semiconductor device. Furthermore, the parasitic capacitance may be further reduced by incorporating the second air gap. As a result, the performance of the semiconductor device may be further enhanced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
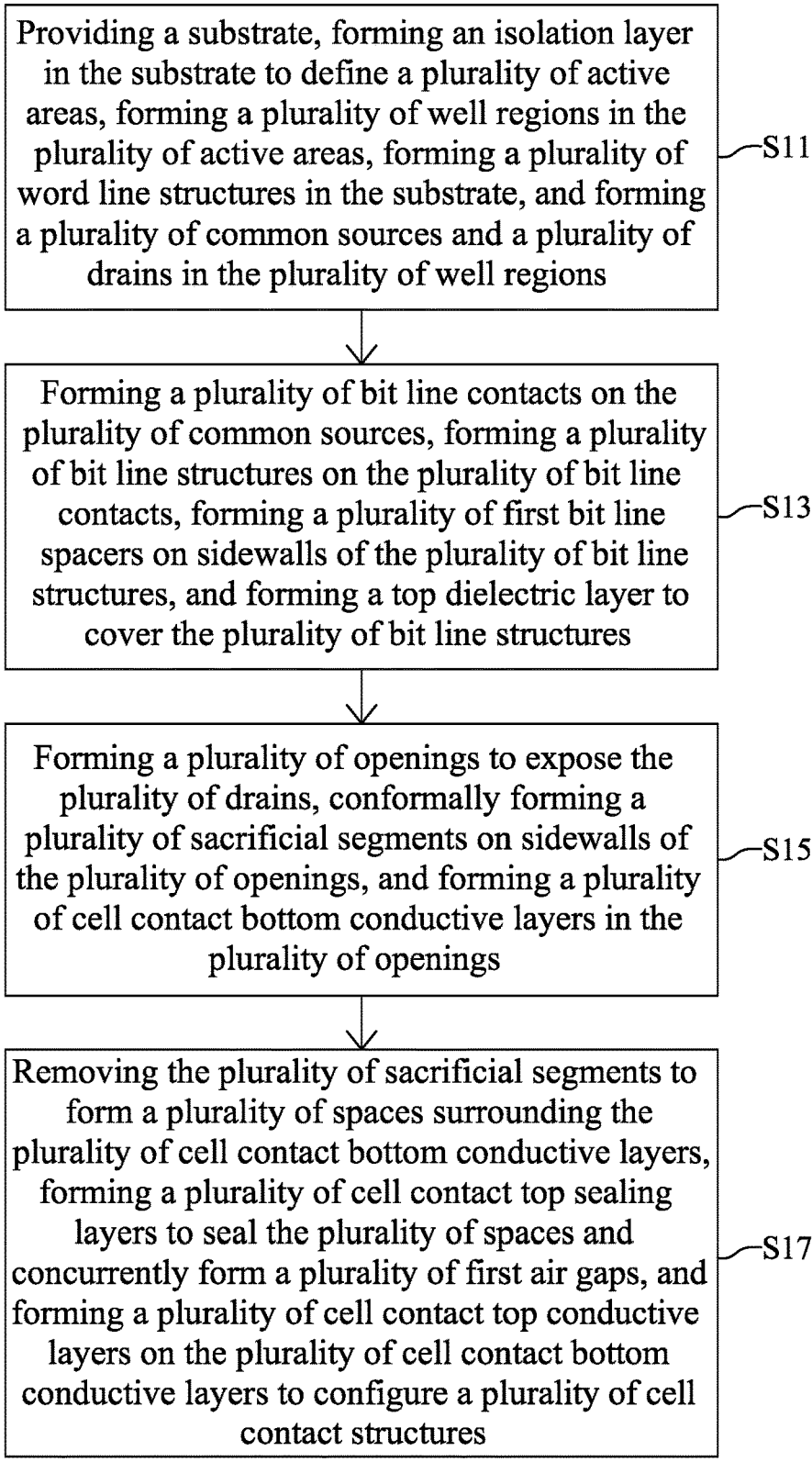
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

Figure 2:
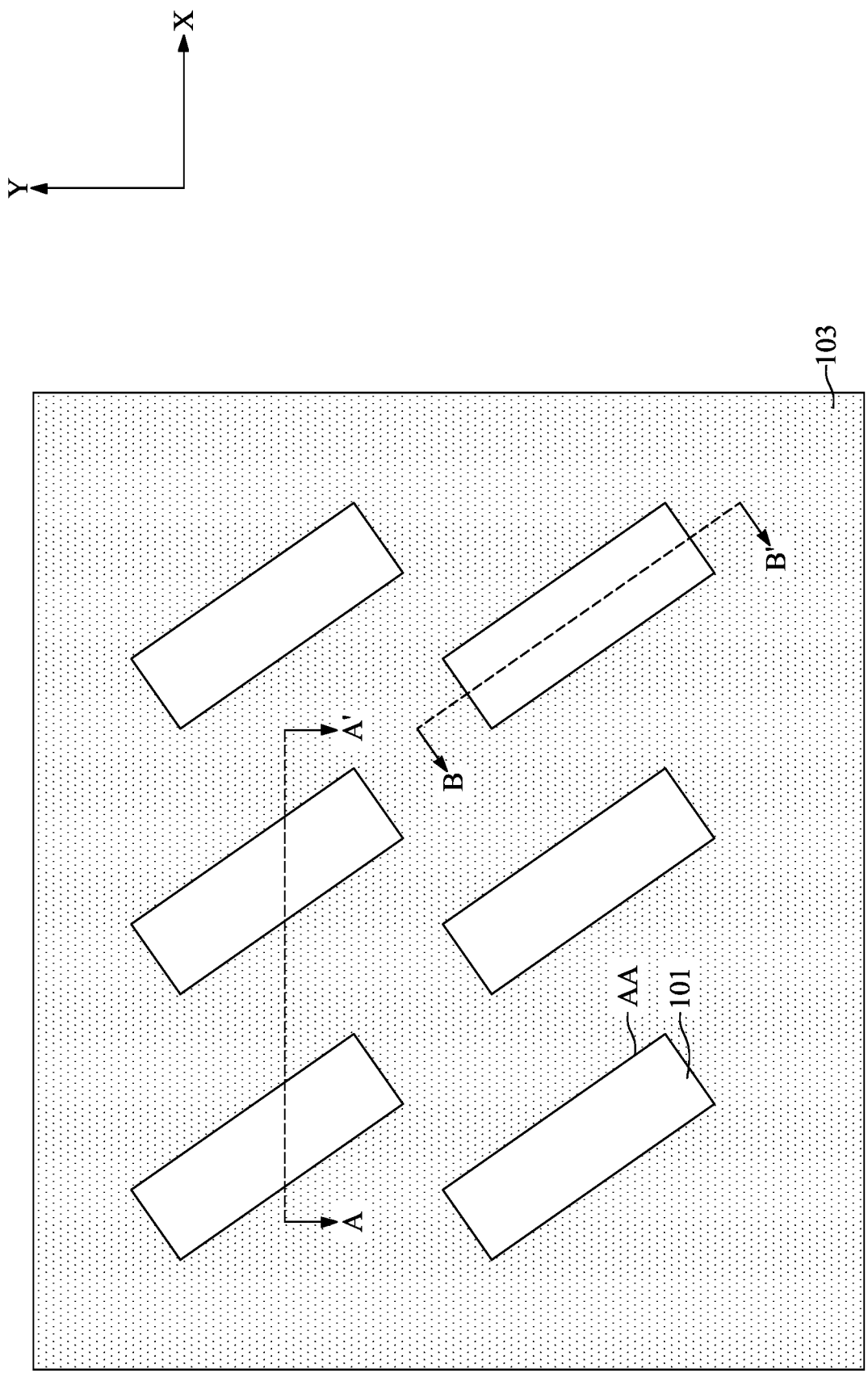
FIG. 2 illustrates, in a schematic top-view diagram, an intermediate semiconductor device in accordance with one embodiment of the present disclosure.
Figure 3:
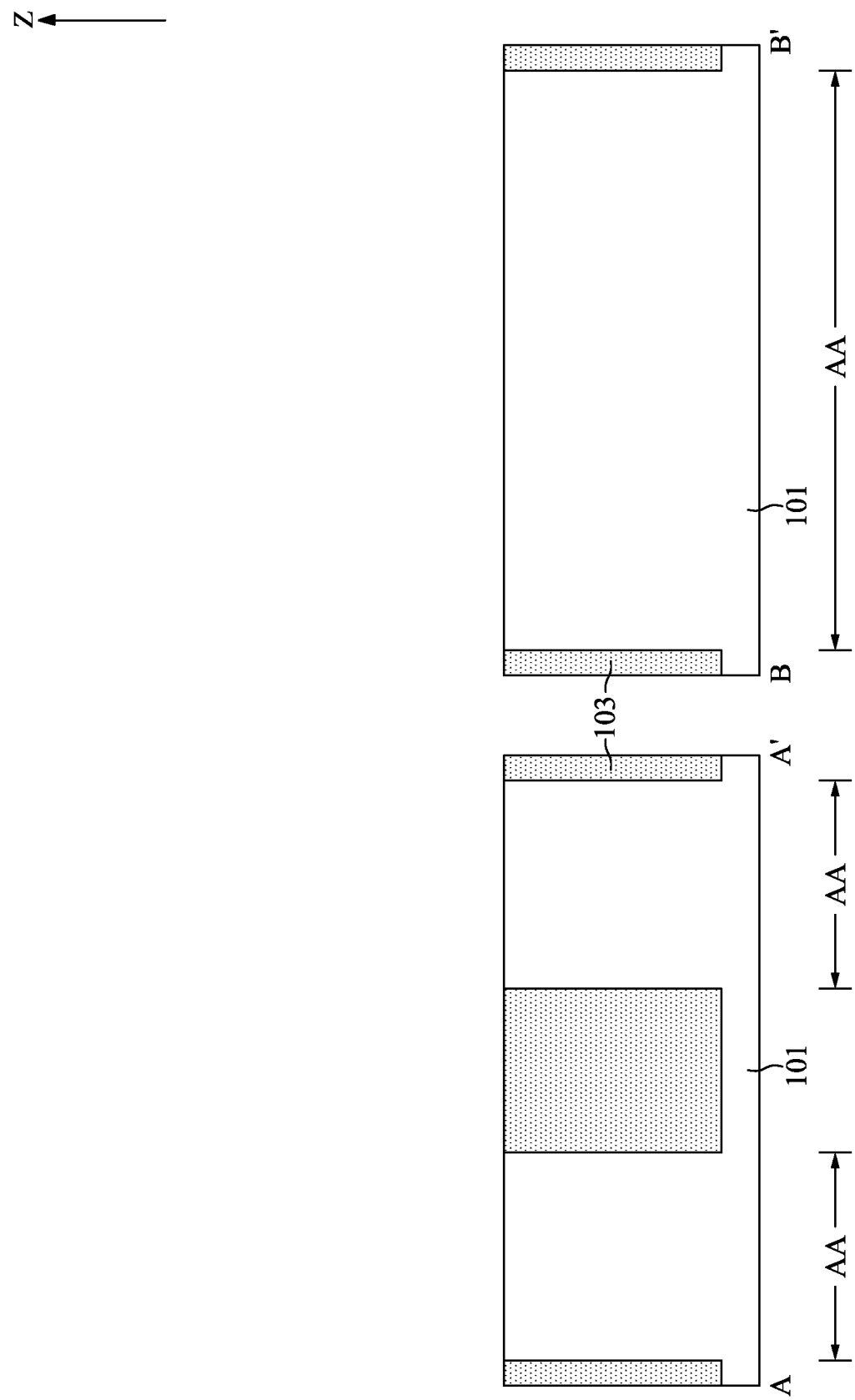
FIG. 3 is a schematic cross-sectional view diagram taken along lines A-A' and B-B' in FIG. 2.
Figure 4:
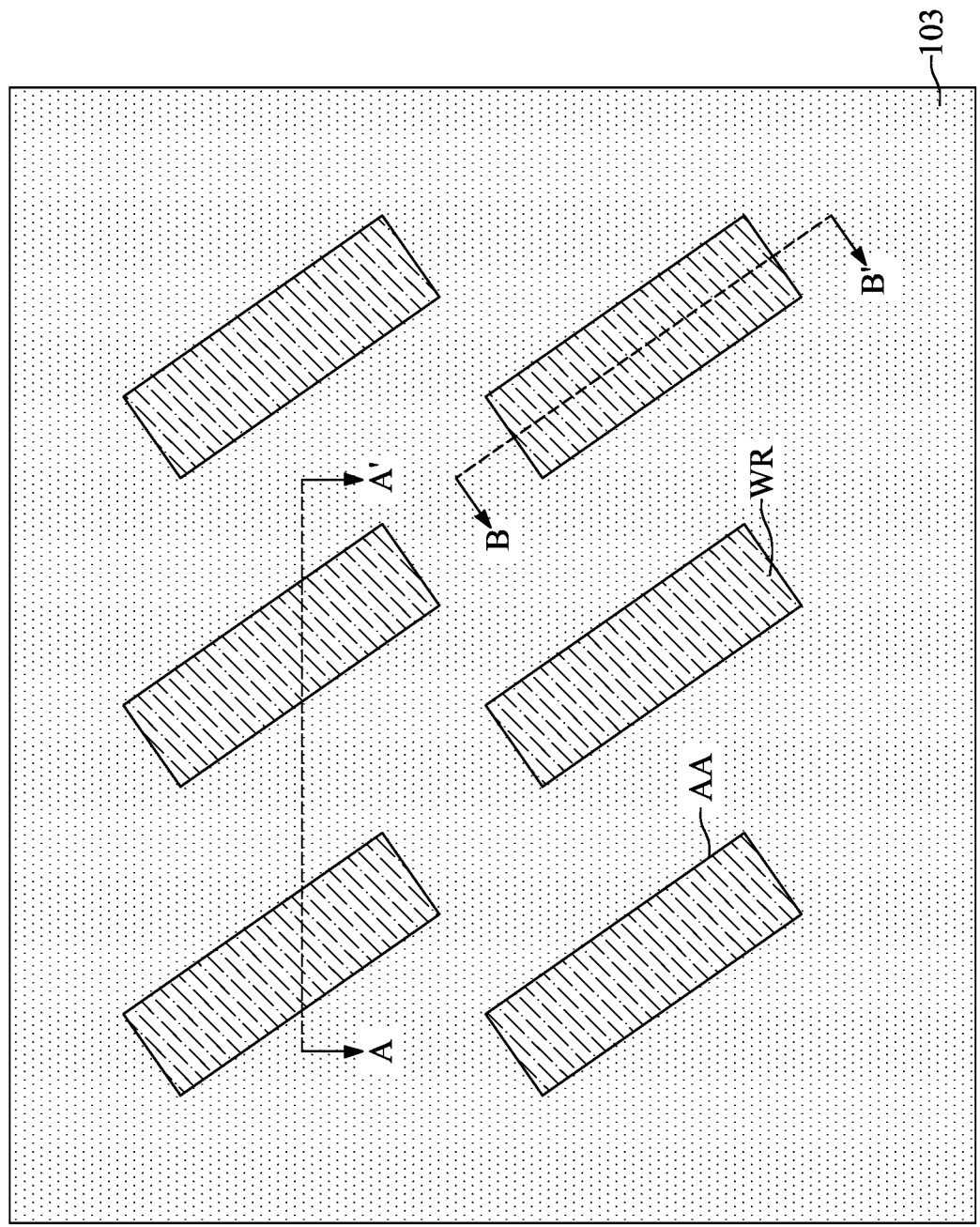
FIG. 4 illustrates, in a schematic top-view diagram, an intermediate semiconductor device in accordance with one embodiment of the present disclosure.
Figure 5:
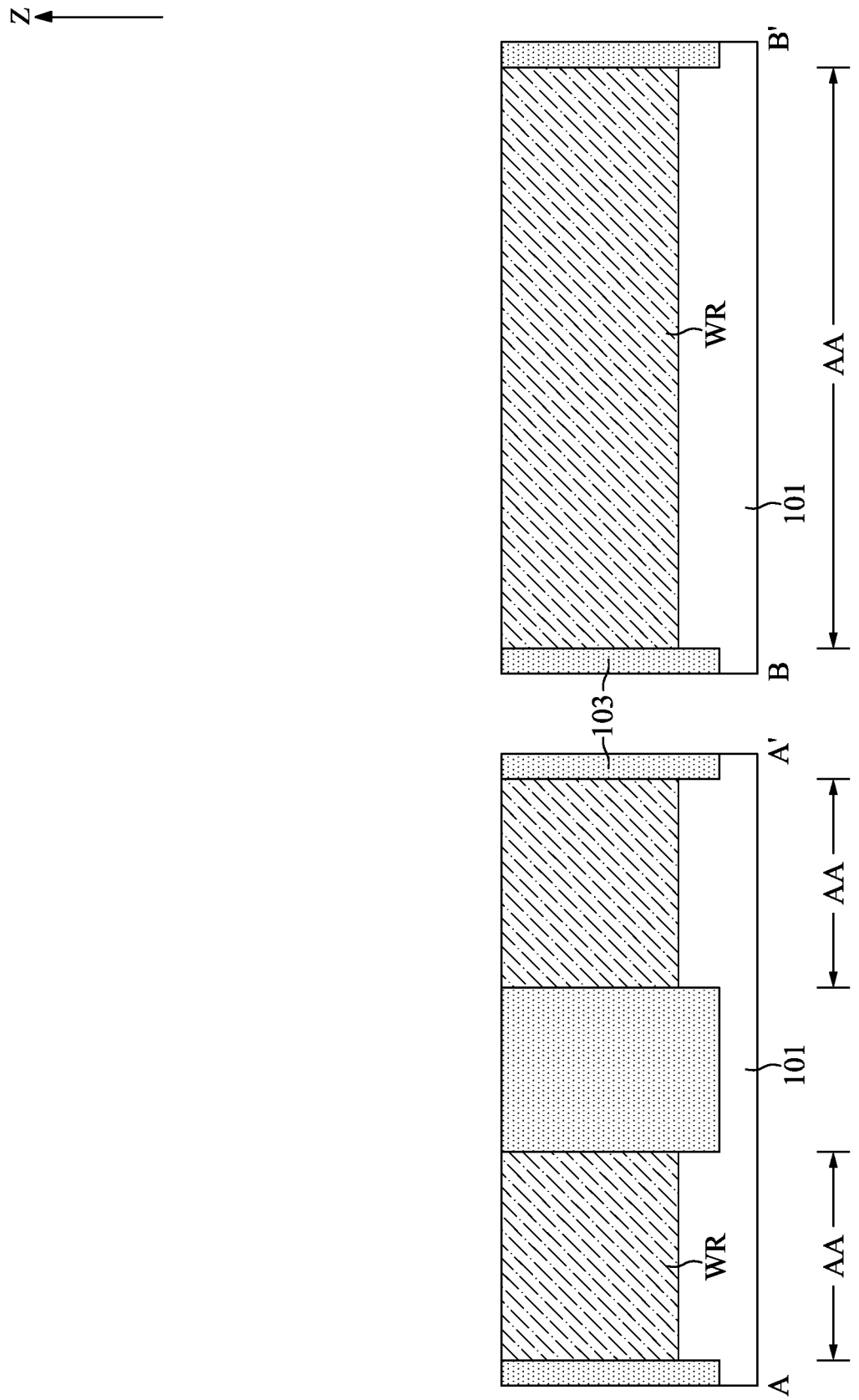
FIG. 5 is a schematic cross-sectional view diagram taken along lines A-A' and B-B' in FIG. 4.
Figure 6:
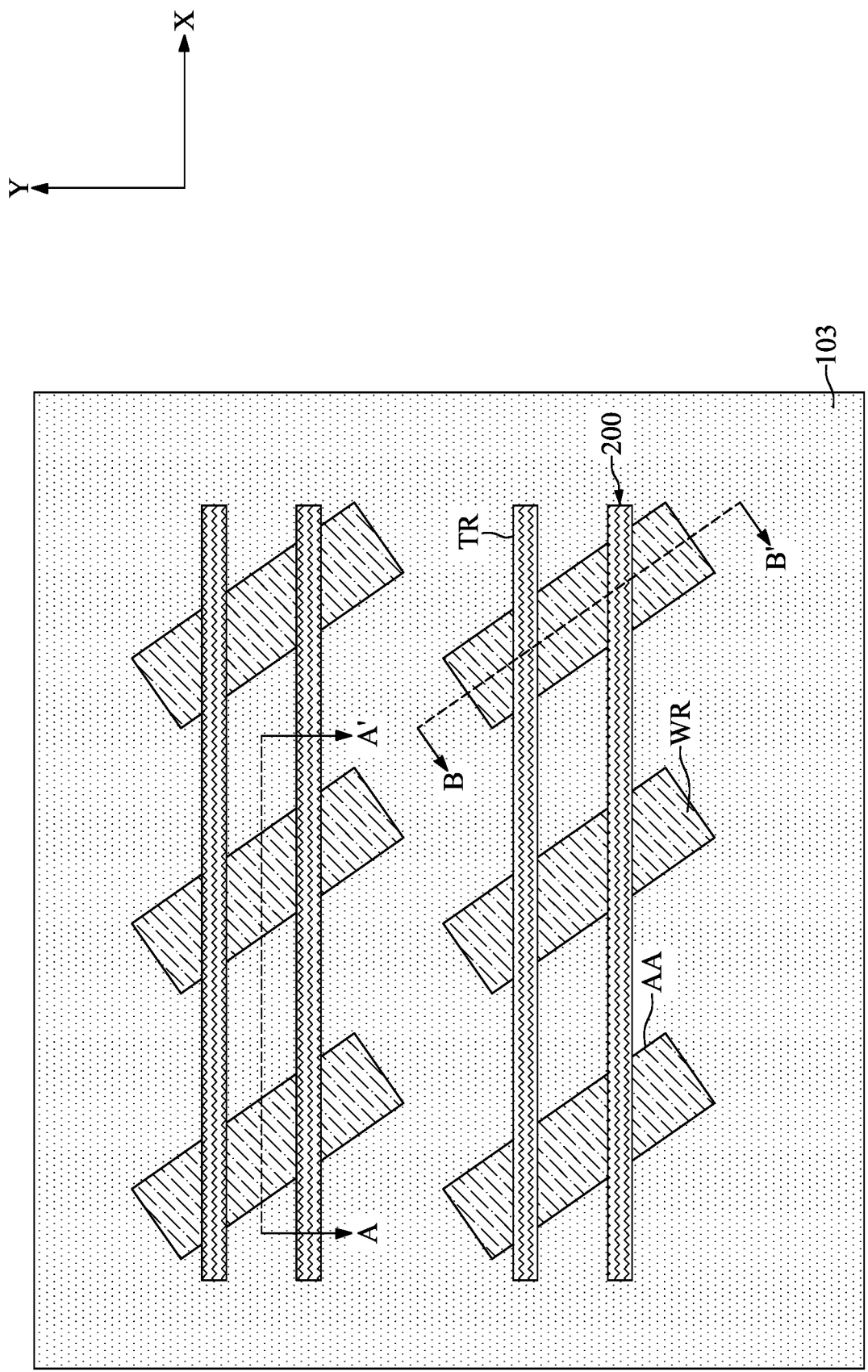
FIG. 6 illustrates, in a schematic top-view diagram, an intermediate semiconductor device in accordance with one embodiment of the present disclosure.
Figure 7:
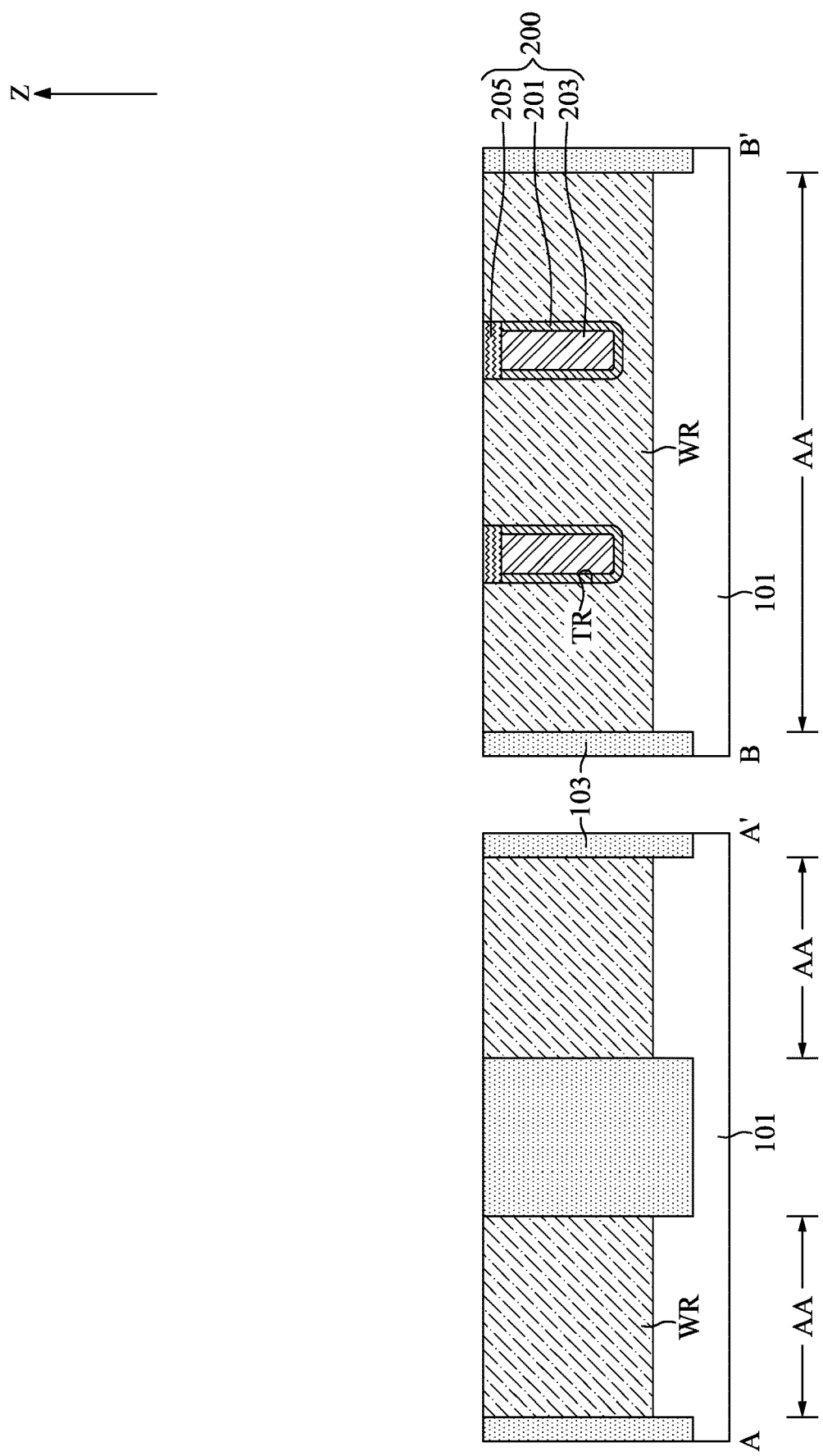
FIG. 7 is a schematic cross-sectional view diagram taken along lines A-A' and B-B' in FIG. 6.
Figure 8:
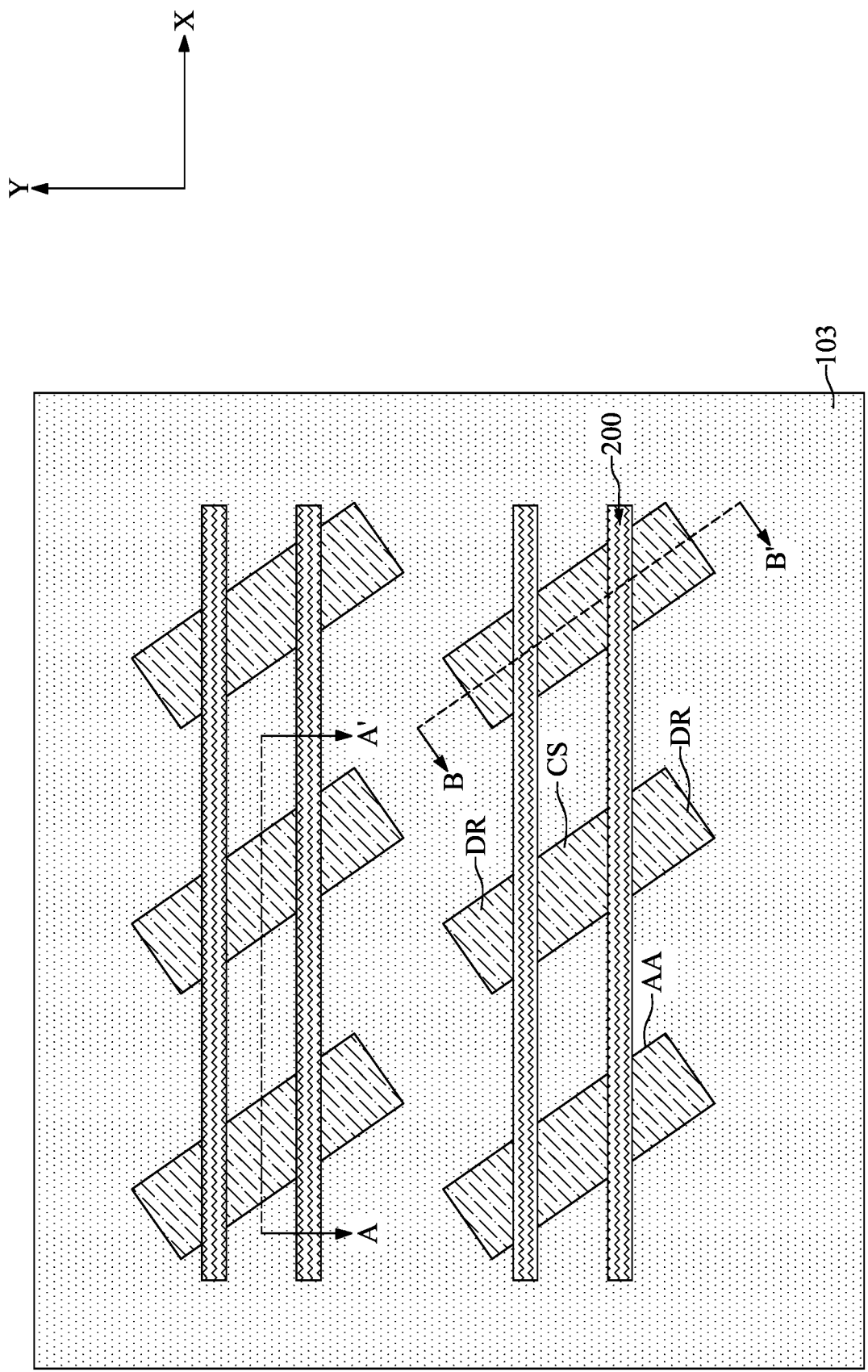
FIG. 8 illustrates, in a schematic top-view diagram, an intermediate semiconductor device in accordance with one embodiment of the present disclosure.
Figure 9:
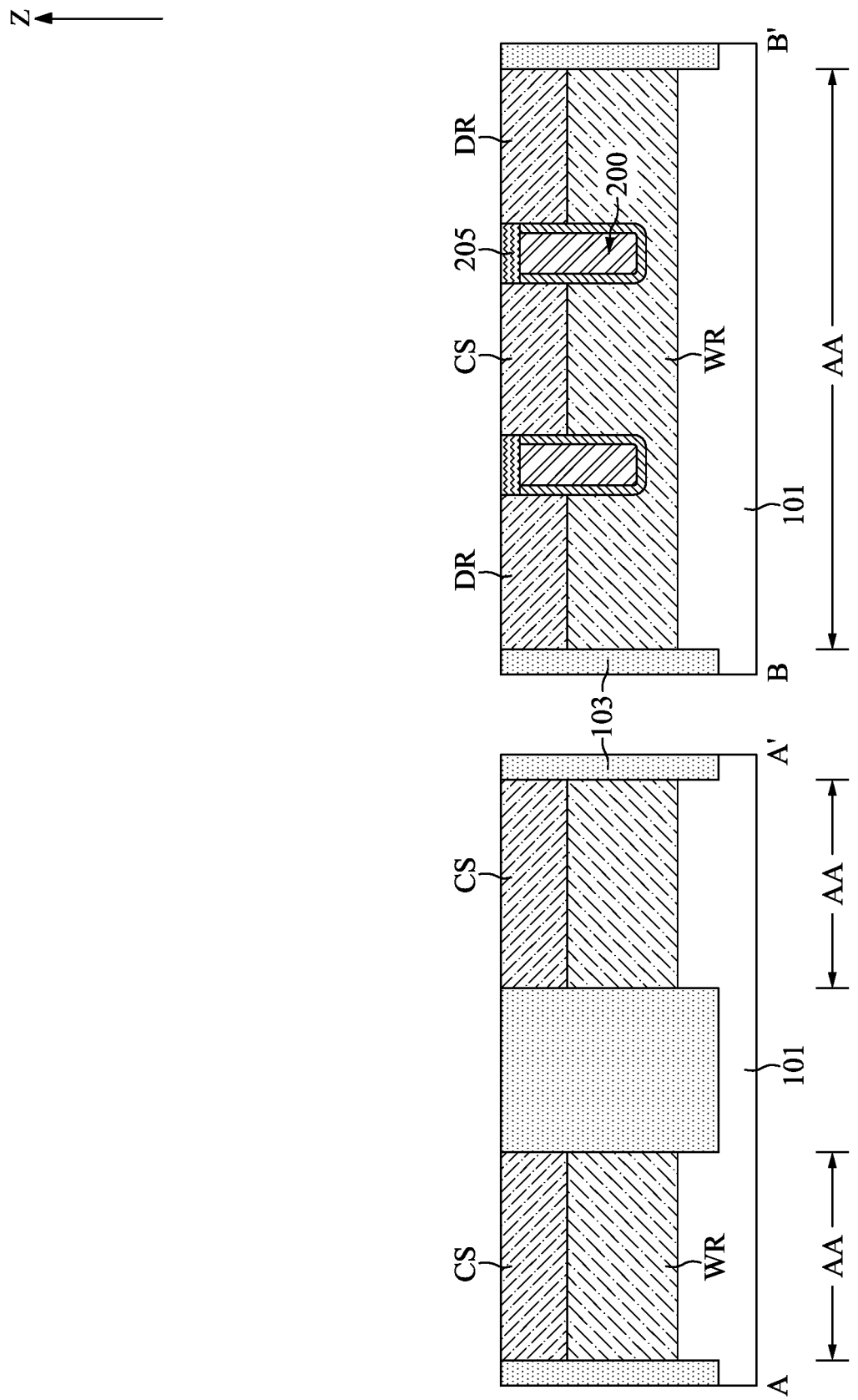
FIG. 9 is a schematic cross-sectional view diagram taken along lines A-A' and B-B' in FIG. 8.

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIG. 3 is a schematic cross-sectional view diagram taken along lines A-A' and B-B' in FIG. 2. FIG. 4 illustrates, in a schematic top-view diagram, an intermediate semiconductor device in accordance with one embodiment of the present disclosure. FIG. 5 is a schematic cross-sectional view diagram taken along lines A-A' and B-B' in FIG. 4. FIG. 6 illustrates, in a schematic top-view diagram, an intermediate semiconductor device in accordance with one embodiment of the present disclosure. FIG. 7 is a schematic cross-sectional view diagram taken along lines A-A' and B-B' in FIG. 6. FIG. 8 illustrates, in a schematic top-view diagram, an intermediate semiconductor device in accordance with one embodiment of the present disclosure. FIG. 9 is a schematic cross-sectional view diagram taken along lines A-A' and B-B' in FIG. 8.

With reference to FIGS. 1 to 9, at step S11, a substrate 101 may be provided, an isolation layer 103 may be formed in the substrate 101 to define a plurality of active areas AA, a plurality of well regions WR may be formed in the plurality of active areas AA, a plurality of word line structures 200 may be formed in the substrate 101, and a plurality of common sources CS and a plurality of drains DR may be formed in the plurality of well regions WR.

With reference to FIGS. 2 and 3, in some embodiments, the substrate 101 may include a bulk semiconductor substrate that is composed of at least one semiconductor material. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and about 200 nm. The insulator layer may eliminate leakage current between adjacent elements in the substrate 101 and reduce parasitic capacitance associated with source/drains.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIGS. 2 and 3, a series of deposition processes may be performed to deposit a pad oxide layer (not shown for clarity) and a pad nitride layer (not shown for clarity) on the substrate 101. A photolithography process may be performed to define the position of the isolation layer 103. After the photolithography process, an etch process, such as an anisotropic dry etch process, may be performed to form trenches penetrating through the pad oxide layer, the pad nitride layer, and extending to the substrate 101. An insulating material such as silicon oxide, silicon nitride, silicon oxynitride, or silicon nitride oxide may be deposited into the trenches and a planarization process, such as chemical mechanical polishing, may be subsequently performed to remove excess filling material until a top surface of the substrate 101 is exposed so as to form the isolation layer 103. The top surface of the isolation layer 103 and the top surface of the substrate 101 may be substantially coplanar.

With reference to FIGS. 2 and 3, the isolation layer 103 may define the plurality of active areas AA. In some embodiments, the plurality of active areas AA may extend along a direction slant with respect to the X axis and the Y axis in a top-view perspective.

It should be noted that each of the active areas AA may comprise a portion of the substrate 101 and the space above the portion of the substrate 101. Describing an element as being disposed on the active area AA means that the element is disposed on a top surface of the portion of the substrate 101. Describing an element as being disposed in the active area AA means that the element is disposed in the portion of the substrate 101; however, a top surface of the element may be even with the top surface of the portion of the substrate 101. Describing an element as being disposed above the active area AA means that the element is disposed above the top surface of the portion of the substrate 101.

It should be noted that, in the description of the present disclosure, a surface of an element (or a feature) located at the highest vertical level along the Z axis is referred to as a top surface of the element (or the feature). A surface of an element (or a feature) located at the lowest vertical level along the Z axis is referred to as a bottom surface of the element (or the feature).

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 4 and 5, the plurality of well regions WR may be formed in the plurality of active areas AA, respectively and correspondingly. For brevity, clarity, and convenience of description, only one well region WR is described. The well region WR may be formed by an implantation process using, for example, p-type dopants. The well region WR may have a first electrical type (e.g., the p-type). The term "p-type dopant" refers to an impurity that when added to an intrinsic semiconductor material creates deficiencies of valence electrons. In a silicon containing semiconductor material, examples of p-type dopants include, but are not limited to, boron, aluminum, gallium and/or indium.

With reference to FIGS. 6 and 7, a plurality of word line trenches TR may be formed in the well region WR to define the position of the plurality of word line structures 200. The plurality of word line trenches TR may be formed by a photolithography process and a following etch process. In some embodiments, the plurality of word line trenches TR may have a line shape and extend along the direction X and traversing the plurality of active areas AA in a top-view perspective. For example, each active area AA may be intersected with two word line trenches TR. The plurality of word line structures 200 (e.g., two word line structures 200) may be formed in the two word line trenches TR, respectively and correspondingly. For brevity, clarity, and convenience of description, only one word line structure 200 is described. The word line structure 200 may include a word line dielectric layer 201, a word line conductive layer 203, and a word line capping layer 205.

With reference to FIGS. 6 and 7, the word line dielectric layer 201 may be conformally formed on the inner surface of the word line trench TR. The word line dielectric layer 201 may have a U-shaped cross-sectional profile. In other words, the word line dielectric layer 201 may be inwardly formed in the well region WR. In some embodiments, the word line dielectric layer 201 may be formed by a thermal oxidation process. For example, the word line dielectric layer 201 may be formed by oxidizing the inner surface of the word line trench TR. In some embodiments, the word line dielectric layer 201 may be formed by a deposition process such as a chemical vapor deposition or an atomic layer deposition. The word line dielectric layer 201 may include a high-k material, an oxide, a nitride, an oxynitride or combinations thereof. In some embodiments, after a liner polysilicon layer (not shown for clarity) is deposited, the word line dielectric layer 201 may be formed by radical-oxidizing the liner polysilicon layer. In some embodiments, after a liner silicon nitride layer (not shown for clarity) is formed, the word line dielectric layer 201 may be formed by radical-oxidizing the liner silicon nitride layer.

In some embodiments, the high-k material may include a hafnium-containing material. The hafnium-containing material may be, for example, hafnium oxide, hafnium silicon oxide, hafnium silicon oxynitride, or a combination thereof. In some embodiments, the high-k material may be, for example, lanthanum oxide, lanthanum aluminum oxide, zirconium oxide, zirconium silicon oxide, zirconium silicon oxynitride, aluminum oxide or a combination thereof.

With reference to FIGS. 6 and 7, the word line conductive layer 203 may be formed on the word line dielectric layer 201. In some embodiments, in order to form the word line conductive layer 203, a conductive layer (not shown for clarity) may be formed to fill the word line trench TR, and a recessing process may be subsequently performed. The recessing process may be performed as an etching back process or sequentially performed as the planarization process and an etching back process. The word line conductive layer 203 may have a recessed shape that partially fills the word line trench TR. That is, the top surface of the word line conductive layer 203 may be at a vertical level lower than the top surface of the substrate 101.

In some embodiments, the word line conductive layer 203 may include a metal, a metal nitride, or a combination thereof. For example, the word line conductive layer 203 may be formed of titanium nitride, tungsten, or a titanium nitride/tungsten. After the titanium nitride is conformally formed, the titanium nitride/tungsten may have a structure where the word line trench TR is partially filled using tungsten. The titanium nitride or the tungsten may be solely used for the word line conductive layer 203. In some embodiments, the word line conductive layer 203 may be formed of, for example, a conductive material such as polycrystalline silicon, polycrystalline silicon germanium, or a combination thereof. In some embodiments, the word line conductive layer 203 may be doped with a dopant such as phosphorus, arsenic, antimony, or boron. In some embodiments, the word line conductive layer 203 may be formed of, for example, tungsten, aluminum, titanium, copper, the like, or a combination thereof.

With reference to FIGS. 6 and 7, a dielectric material (not shown) may be deposited by, for example chemical vapor deposition, to completely fill the word line trenches TR and covering the top surface of the substrate 101. A planarization process, such as chemical mechanical polishing, may be performed to provide a substantially flat surface for subsequent processing steps and form the word line capping layer 205. In some embodiments, the word line capping layer 205 may be formed of, for example, silicon oxide, silicon nitride, or other applicable dielectric material.

With reference to FIGS. 8 and 9, the plurality of common sources CS and the plurality of drains DR may be formed in the plurality of active areas AA. For brevity, clarity, and convenience of description, only the common source CS and the two drains DR in one active area AA are described. All other active areas AA may have the same elements and may have the same configuration. The two drains DR may be respectively formed between the two word line structures 200 and the isolation layer 103. The common source CS may be formed between the two word line structures 200. The common source CS and the drains DR may be formed by an implantation process. The implantation process may employ, for example, n-type dopants. The n-type dopants may be added to an intrinsic semiconductor to contribute free electrons to the intrinsic semiconductor. In a silicon-containing substrate, examples of n-type dopants, i.e., impurities, include but are not limited to antimony, arsenic, and phosphorous. The common source CS and the drains DR may have a second electrical type (e.g., the n-type) opposite to the electrical type of the well region WR. In some embodiments, the dopant concentration of the common source CS and the drains DR may be between about 1E19 atoms/cm^3 and about 1E21 atoms/cm^3; although other dopant concentrations that are lesser than, or greater than, the aforementioned range may also be employed in the present application.

In some embodiments, an annealing process may be performed to activate the common source CS, the drains DR, and the well region WR. The annealing process may have a process temperature between about 800° C. and about 1250° C. The annealing process may have a process duration between about 1 millisecond and about 500 milliseconds. The annealing process may be, for example, a rapid thermal anneal, a laser spike anneal, or a flash lamp anneal.

Figure 10:
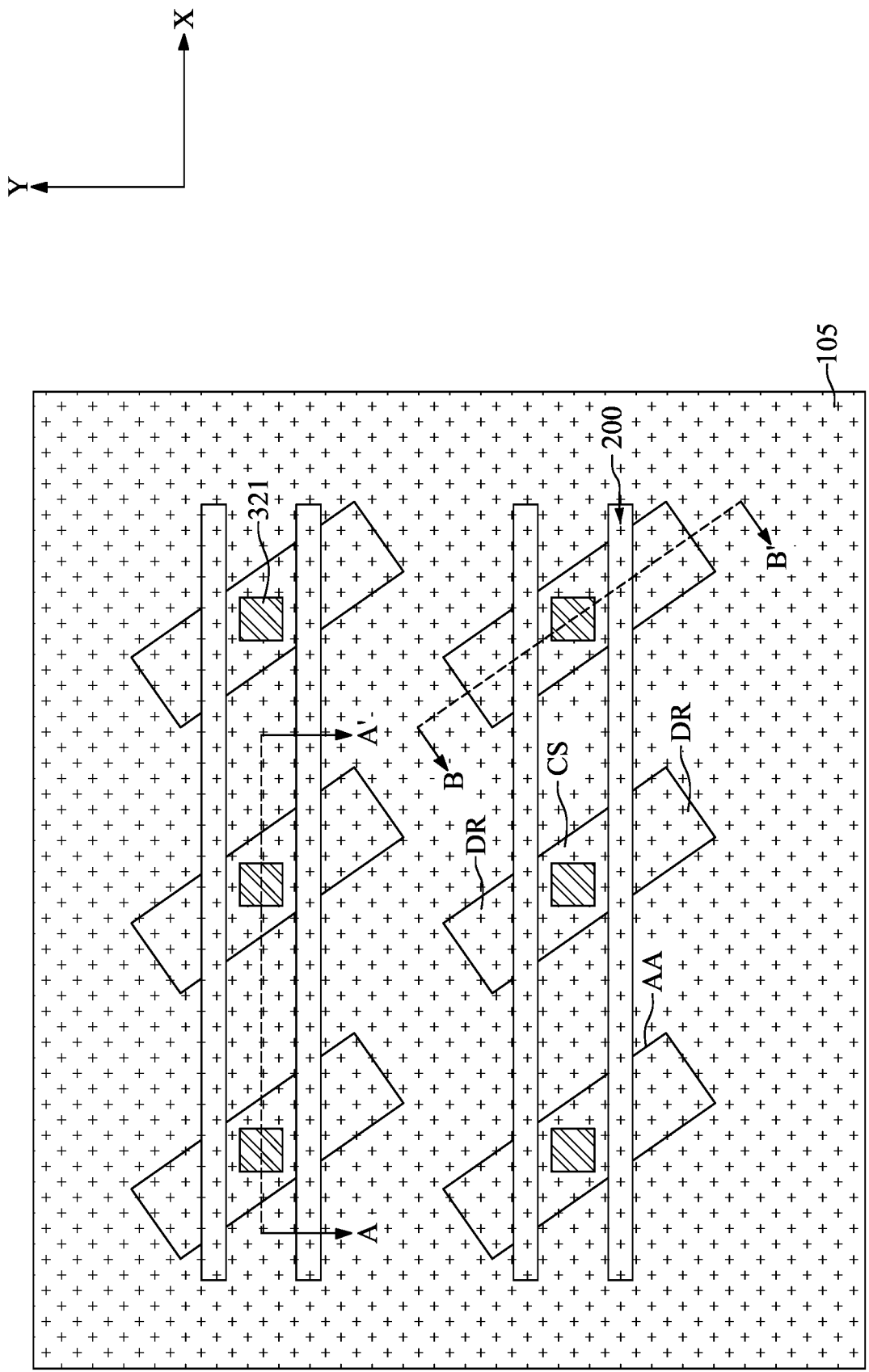
FIG. 10 illustrates, in a schematic top-view diagram, an intermediate semiconductor device in accordance with one embodiment of the present disclosure.
Figure 11:
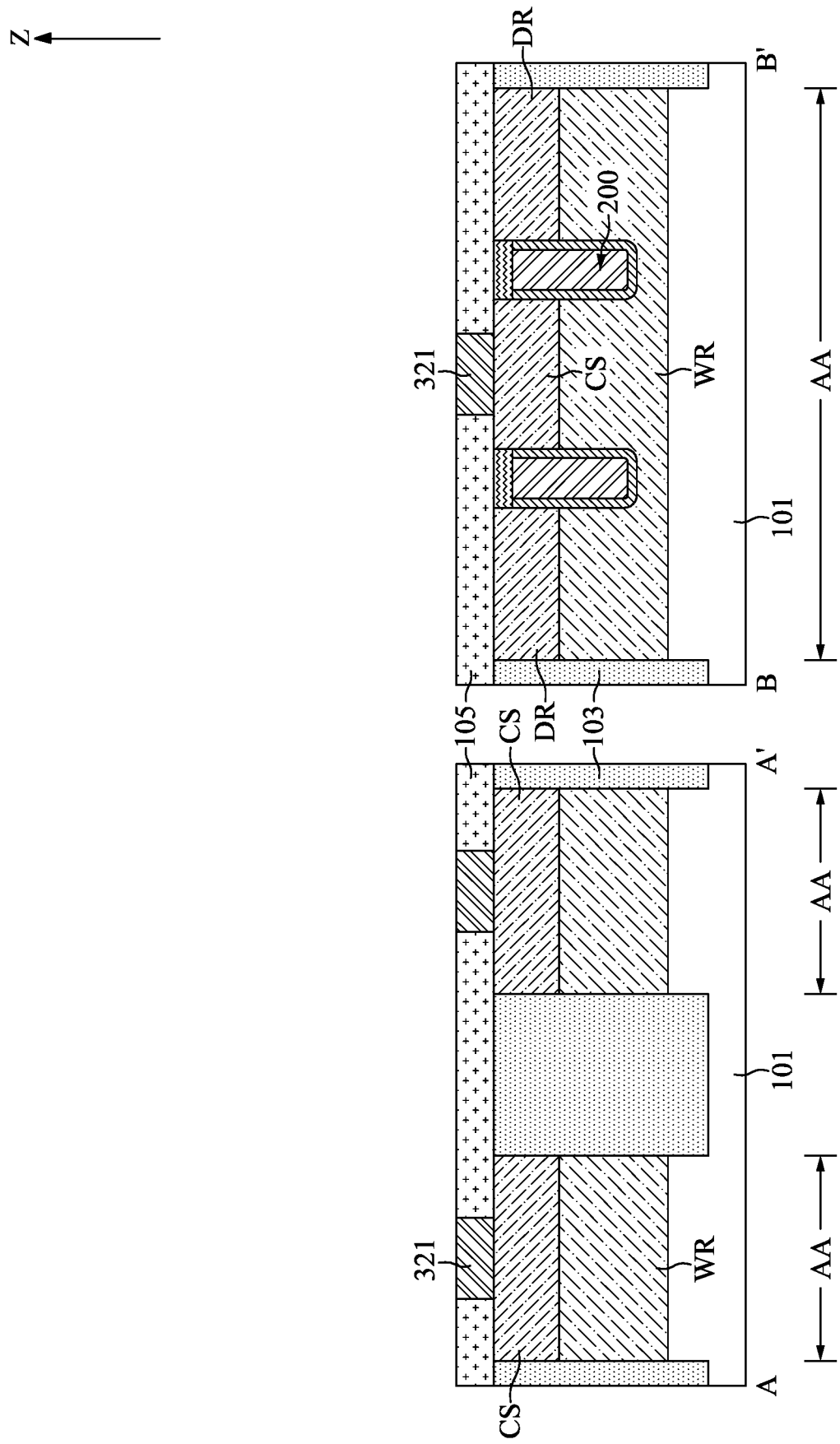
FIG. 11 is a schematic cross-sectional view diagram taken along lines A-A' and B-B' in FIG. 10.
Figure 12:
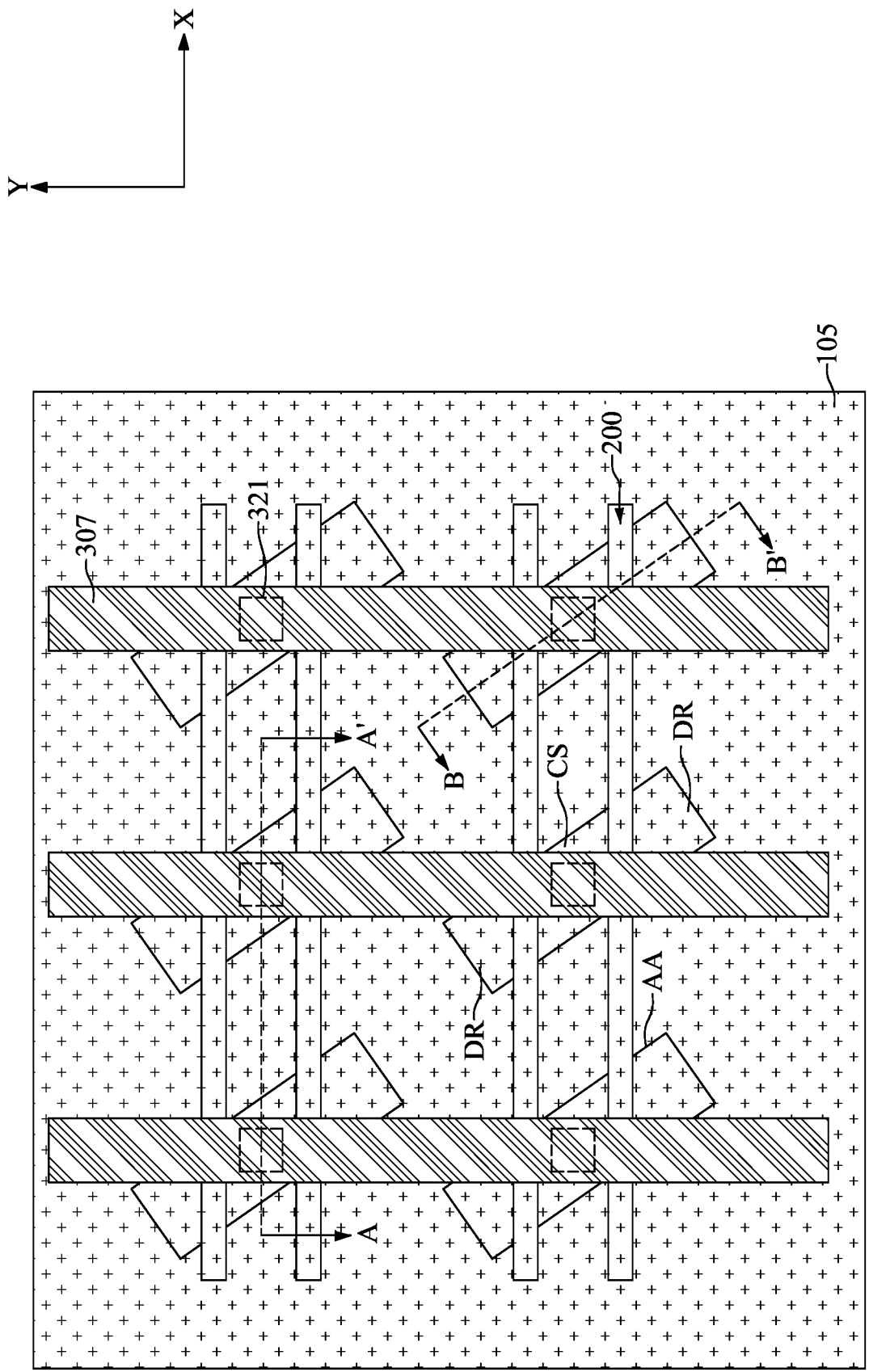
FIG. 12 illustrates, in a schematic top-view diagram, an intermediate semiconductor device in accordance with one embodiment of the present disclosure.
Figure 13:
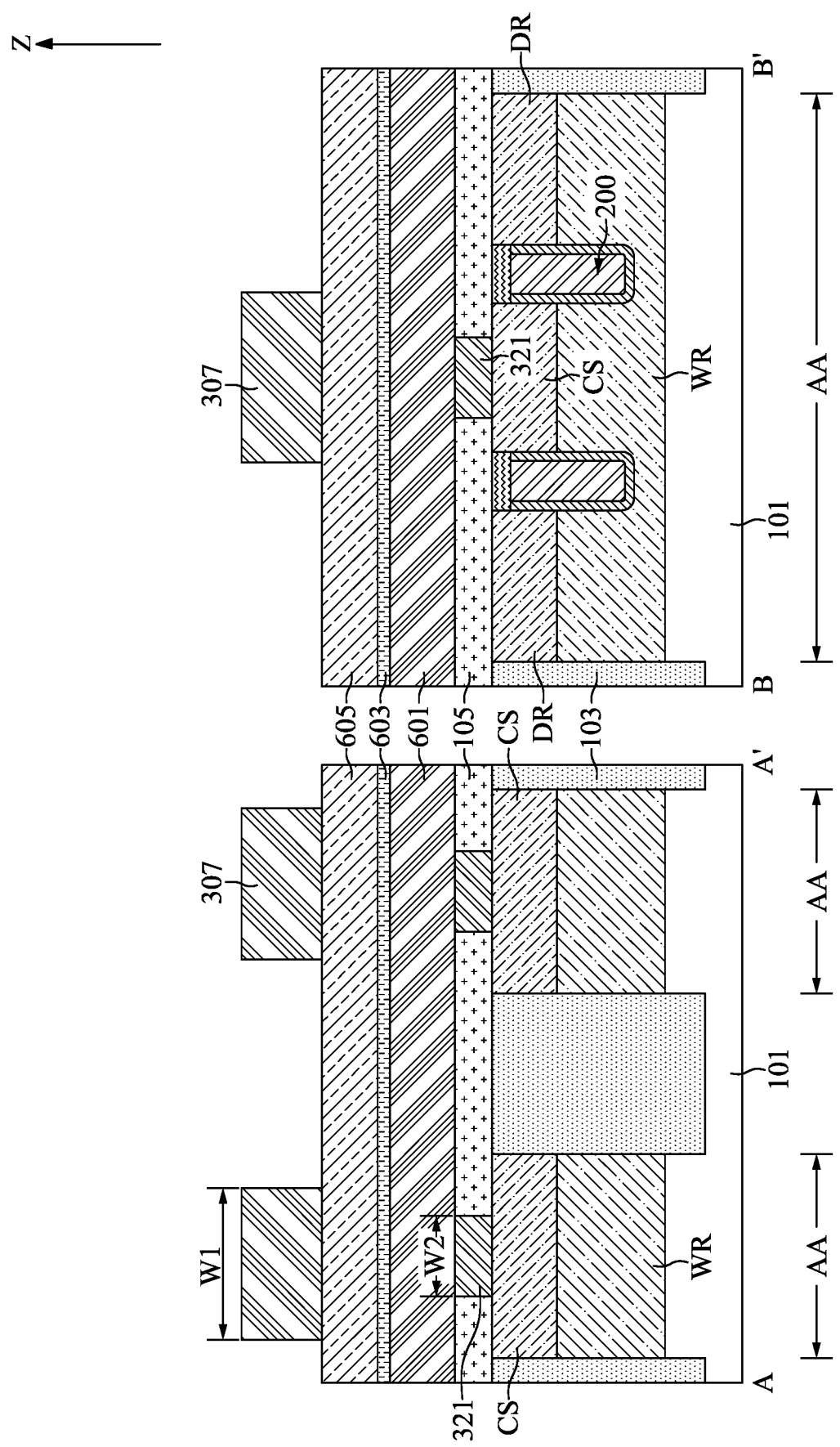
FIGS. 13 and 14 are schematic cross-sectional view diagrams taken along lines A-A' and B-B' in FIG. 12 illustrating part of the flow for fabricating the semiconductor device in accordance with one embodiment of the present disclosure.
Figure 14:
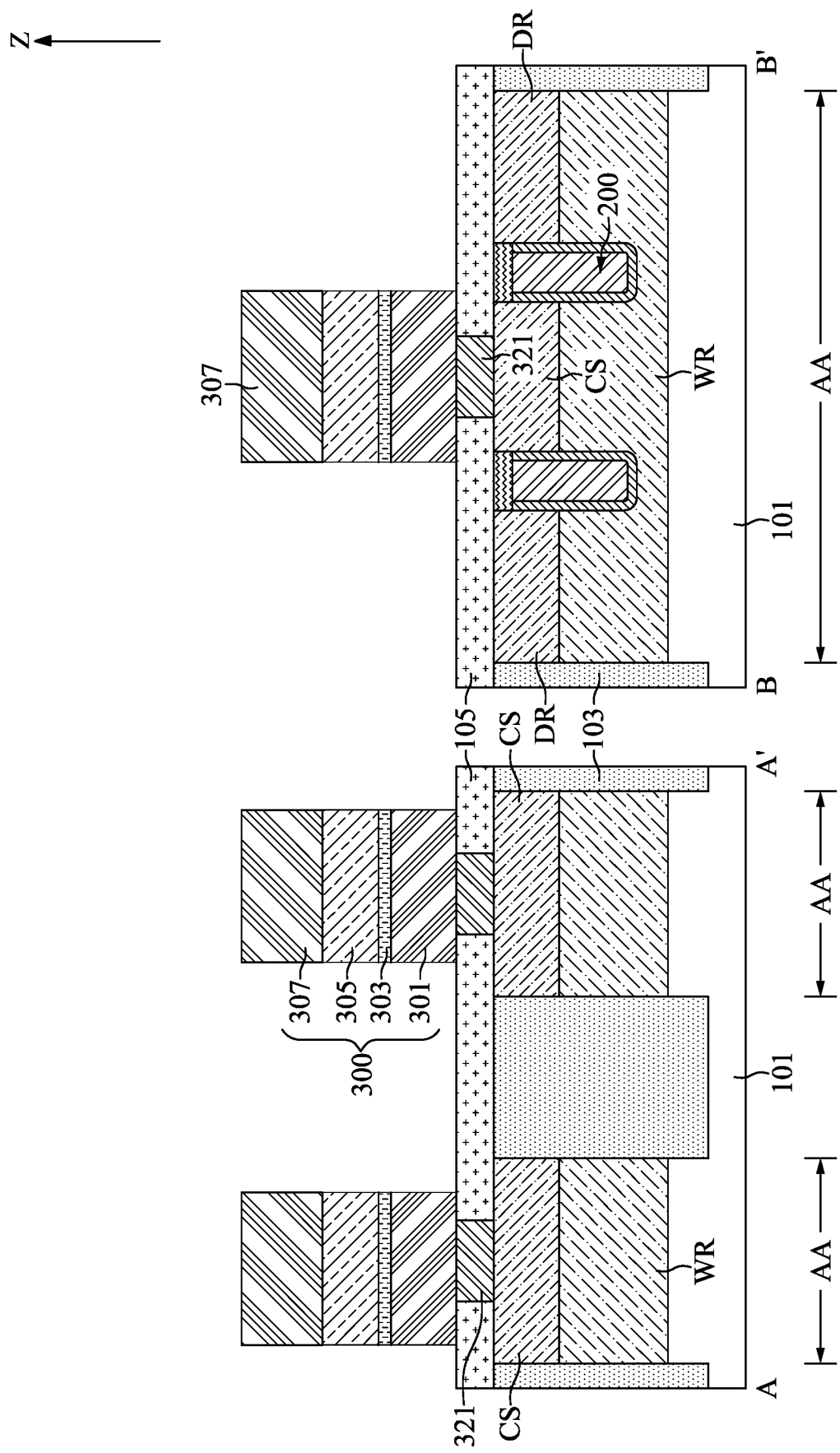
Figure 15:
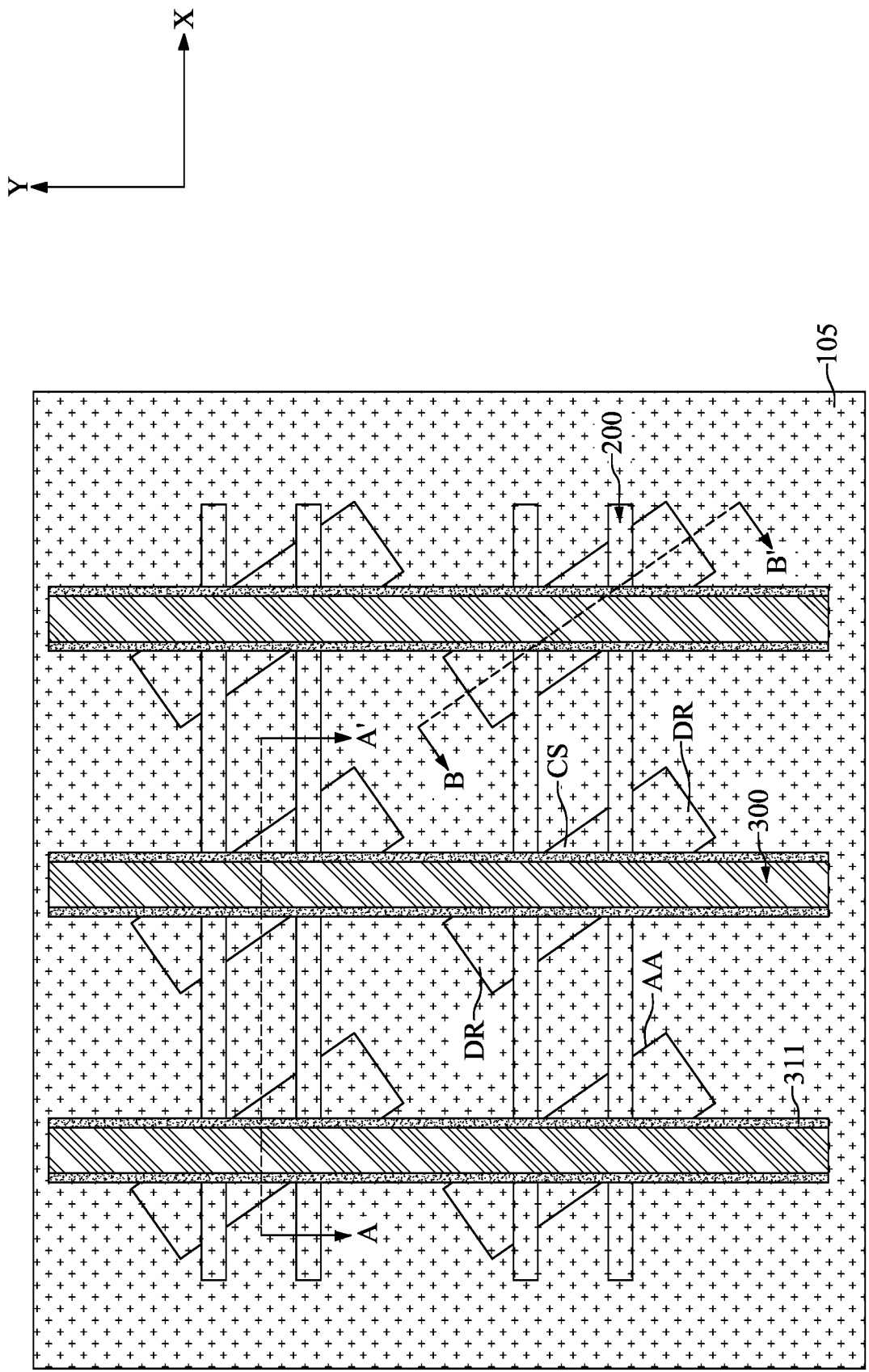
FIG. 15 illustrates, in a schematic top-view diagram, an intermediate semiconductor device in accordance with one embodiment of the present disclosure.
Figure 16:
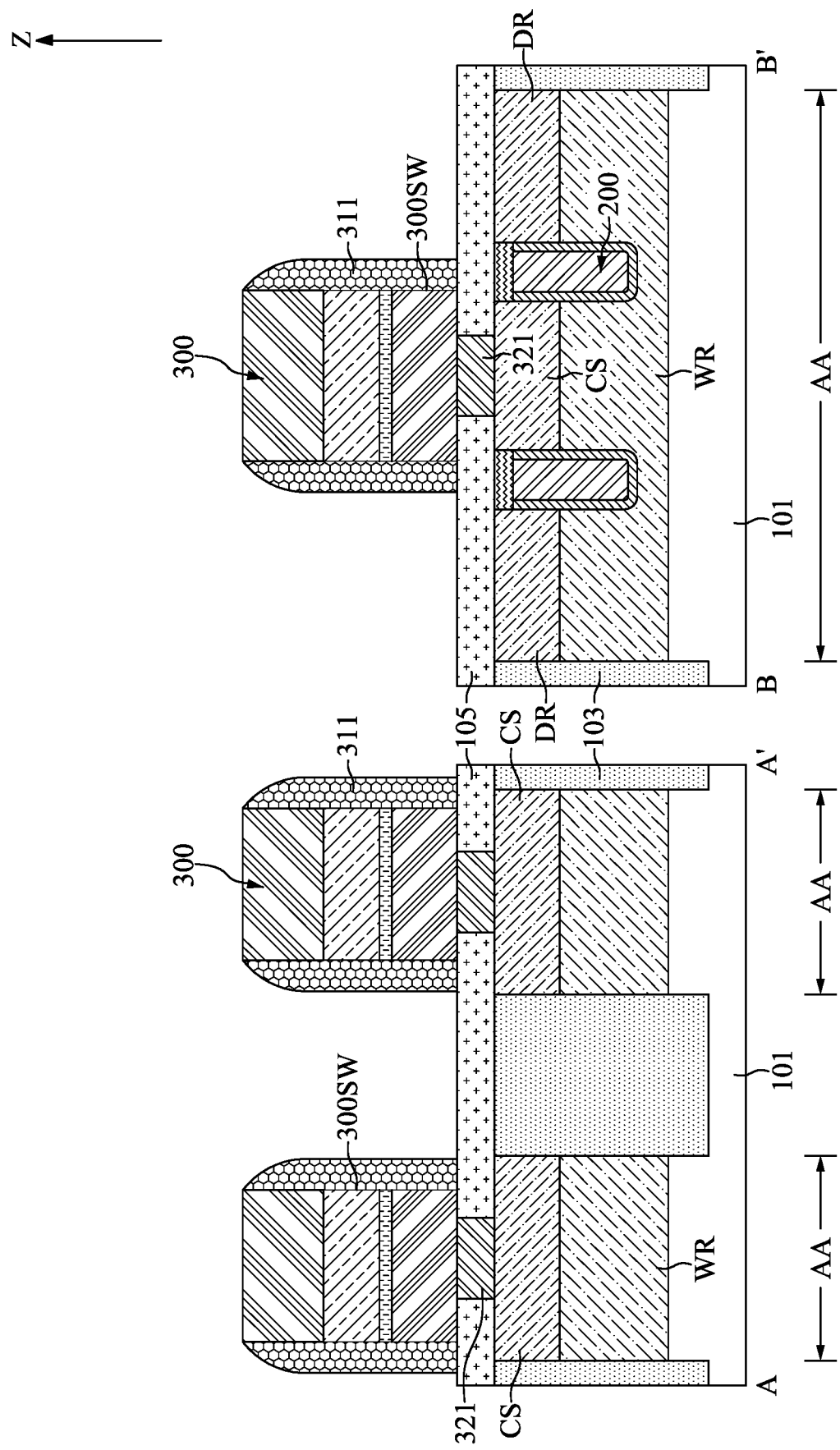
FIGS. 16 and 17 are schematic cross-sectional view diagrams taken along lines A-A' and B-B' in FIG. 15 illustrating part of the flow for fabricating the semiconductor device in accordance with one embodiment of the present disclosure.
Figure 17:
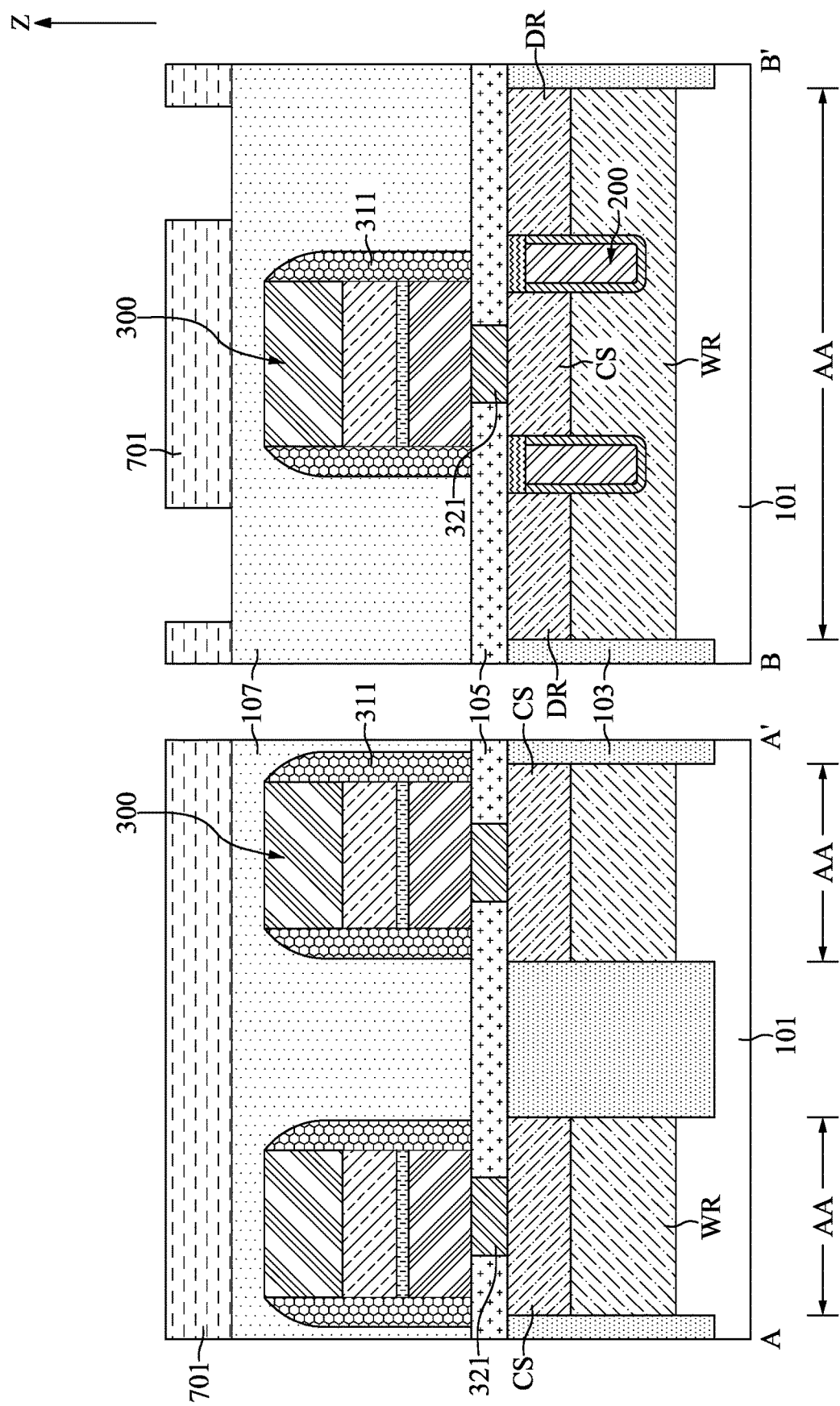

FIG. 10 illustrates, in a schematic top-view diagram, an intermediate semiconductor device in accordance with one embodiment of the present disclosure. FIG. 11 is a schematic cross-sectional view diagram taken along lines A-A' and B-B' in FIG. 10. FIG. 12 illustrates, in a schematic top-view diagram, an intermediate semiconductor device in accordance with one embodiment of the present disclosure. FIGS. 13 and 14 are schematic cross-sectional view diagrams taken along lines A-A' and B-B' in FIG. 12 illustrating part of the flow for fabricating the semiconductor device 1A in accordance with one embodiment of the present disclosure. FIG. 15 illustrates, in a schematic top-view diagram, an intermediate semiconductor device in accordance with one embodiment of the present disclosure. FIGS. 16 and 17 are schematic cross-sectional view diagrams taken along lines A-A' and B-B' in FIG. 15 illustrating part of the flow for fabricating the semiconductor device 1A in accordance with one embodiment of the present disclosure.

With reference to FIG. 1 and FIGS. 10 to 17, at step S13, a plurality of bit line contacts 321 may be formed on the plurality of common sources CS, a plurality of bit line structures 300 may be formed on the plurality of bit line contacts 321, a plurality of first bit line spacers 311 may be formed on sidewalls of the plurality of bit line structures 300, and a top dielectric layer 107 may be formed to cover the plurality of bit line structures 300.

With reference to FIGS. 10 and 11, a bottom dielectric layer 105 may be formed on the substrate 101. The bottom dielectric layer 105 may serve as an etching stop layer for the subsequent semiconductor processes. Generally, the etching stop layer may provide a mechanism to stop an etching process when forming conductive features. In some embodiments, the bottom dielectric layer 105 may be preferably formed of a dielectric material having a different etch selectivity from adjacent layers. For example, the bottom dielectric layer 105 may be formed of silicon nitride, silicon carbonitride, silicon oxycarbide, or the like. The bottom dielectric layer 105 may be deposited by chemical vapor deposition or plasma enhanced chemical vapor deposition.

With reference to FIGS. 10 and 11, the plurality of bit line contacts 321 may be formed along the bottom dielectric layer 105 and formed on the plurality of common sources CS, respectively and correspondingly. The plurality of bit line contacts 321 may be electrically connected to the plurality of common sources CS, respectively and correspondingly. In some embodiments, the plurality of bit line contacts 321 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the plurality of bit line contacts 321 may have a square-shaped cross-sectional profile in a top-view perspective but is not limited to that shape. In some embodiments, the plurality of bit line contacts 321 may have a rectangle-shaped, a circle-shaped, or other applicable shaped cross-sectional profile in a top-view perspective.

With reference to FIGS. 12 and 13, a layer of first conductive material 601 may be formed on the bottom dielectric layer 105. In some embodiments, the first conductive material 601 may be, for example, polycrystalline silicon, polycrystalline germanium, polycrystalline silicon germanium, doped polycrystalline silicon, doped polycrystalline germanium, doped polycrystalline silicon germanium, or a combination thereof. In some embodiments, the dopants for the first conductive material 601 may include boron, aluminum, gallium, indium, antimony, arsenic, or phosphorus. In some embodiments, the layer of first conductive material 601 may be formed by, for example, chemical vapor deposition or other applicable deposition processes.

With reference to FIGS. 12 and 13, the layer of second conductive material 603 may be formed on the layer of first conductive material 601. In some embodiments, the second conductive material 603 may be, for example, titanium silicide, nickel silicide, nickel platinum silicide, tantalum silicide, or cobalt silicide. In some embodiments, the layer of second conductive material 603 may have a thickness between about 2 nm and about 20 nm.

With reference to FIGS. 12 and 13, the layer of third conductive material 605 may be formed on the layer of second conductive material 603. In some embodiments, the third conductive material 605 may be, for example, titanium, nickel, platinum, tantalum, cobalt, silver, copper, aluminum, other applicable conductive material, or a combination thereof.

For brevity, clarity, and convenience of description, only one bit line capping layer 307 is described.

With reference to FIGS. 12 and 13, the bit line capping layer 307 may be formed on the layer of third conductive material 605 and above the common source CS. The bit line capping layer 307 may have the pattern of the bit line structure 300. In some embodiments, the bit line capping layer 307 may extend along a direction perpendicular to the word line structure 200 in a top-view perspective. In some embodiments, the bit line capping layer 307 may be formed of, for example, silicon oxide, silicon nitride, silicon nitride oxide, silicon oxynitride, or other applicable insulating material. In some embodiments, the width W1 of the bit line capping layer 307 may be greater than the width W2 of the bit line contact 321.

With reference to FIG. 14, a bit line etching process may be performed to remove portions of the first conductive material 601, the second conductive material 603, and the third conductive material 605. In some embodiments, the bit line etching process may be a multi-stage etching process. For example, the bit line etching process may be a three-stage anisotropic dry etching process. The etching chemistry may be different for each stage to provide different etching selectivity.

In some embodiments, the etch rate ratio of the third conductive material 605 to the bit line capping layer 307 may be between about 100:1 and about 1.05:1, between about 15:1 and about 2:1, or between about 10:1 and about 2:1 during the first stage of the bit line etching process. In some embodiments, the etch rate ratio of the third conductive material 605 to the second conductive material 603 may be between about 100:1 and about 1.05:1, between about 15:1 and about 2:1, or between about 10:1 and about 2:1 during the first stage of the bit line etching process.

In some embodiments, the etch rate ratio of the second conductive material 603 to the bit line capping layer 307 may be between about 100:1 and about 1.05:1, between about 15:1 and about 2:1, or between about 10:1 and about 2:1 during the second stage of the bit line etching process. In some embodiments, the etch rate ratio of the second conductive material 603 to the first conductive material 601 may be between about 100:1 and about 1.05:1, between about 15:1 and about 2:1, or between about 10:1 and about 2:1 during the second stage of the bit line etching process.

In some embodiments, the etch rate ratio of the first conductive material 601 to the bit line capping layer 307 may be between about 100:1 and about 1.05:1, between about 15:1 and about 2:1, or between about 10:1 and about 2:1 during the third stage of the bit line etching process. In some embodiments, the etch rate ratio of the first conductive material 601 to the bottom dielectric layer 105 may be between about 100:1 and about 1.05:1, between about 15:1 and about 2:1, or between about 10:1 and about 2:1 during the third stage of the bit line etching process.

With reference to FIG. 14, the remaining first conductive material 601 may be referred to as a bit line bottom conductive layer 301. The bit line bottom conductive layer 301 may be formed on the bit line contact 321 and may be electrically coupled to the common source CS. The remaining second conductive material 603 may be referred to as a bit line middle conductive layer 303. The bit line middle conductive layer 303 may be formed on the bit line bottom conductive layer 301. The remaining third conductive material 605 may be referred to as a bit line top conductive layer 305. The bit line top conductive layer 305 may be formed between the bit line middle conductive layer 303 and the bit line capping layer 307. The bit line bottom conductive layer 301, the bit line middle conductive layer 303, the bit line top conductive layer 305, and the bit line capping layer 307 together configure the bit line structure 300.

With reference to FIGS. 15 and 16, a layer of spacer material (not shown) may be conformally formed to cover the bottom dielectric layer 105 and the plurality of bit line structures 300. In some embodiments, the layer of spacer material may be formed by, for example, atomic layer deposition, chemical vapor deposition, or other applicable deposition process. In some embodiments, the spacer material may be, for example, undoped oxide. In some embodiments, the spacer material may be, for example, silicon oxide, silicon nitride, silicon oxynitride, silicon nitride oxide, or other applicable insulating material. Subsequently, a spacer etching process may be performed to remove portions of the spacer material. The remaining spacer material may be referred to as the plurality of first bit line spacers 311. The plurality of first bit line spacers 311 may be formed on the sidewalls 300SW of the plurality of bit line structures 300. In some embodiments, the spacer etching process may be, for example, an anisotropic etching process such as reactive ion etching.

With reference to FIG. 17, a top dielectric layer 107 may be formed over the substrate 101 to cover the plurality of bit line structures 300 and the plurality of first bit line spacers 311. A planarization process, such as chemical mechanical polishing, may be performed to remove excess material and provide a substantially flat surface for subsequent processing steps. In some embodiments, the top dielectric layer 107 may be formed of, for example, undoped oxide. In some embodiments, the top dielectric layer 107 may include, for example, silicon oxide, undoped silicate glass, a spin-on low-k dielectric layer, a chemical vapor deposition low-k dielectric layer, or a combination thereof. In some embodiments, the top dielectric layer 107 may include a self-planarizing material such as a spin-on glass or a spin-on low-k dielectric material such as SiLK™. In some embodiments, the top dielectric layer 107 may be formed by a deposition process including, for example, chemical vapor deposition, plasma enhanced chemical vapor deposition, evaporation, or spin-on coating.

With reference to FIG. 17, a first mask layer 701 may be formed on the top dielectric layer 107. In some embodiments, the first mask layer 701 may be a photoresist layer. The first mask layer 701 may include the pattern which defines the position and profile of the plurality of cell contact structures 400 which will be illustrated later.

Figure 18:
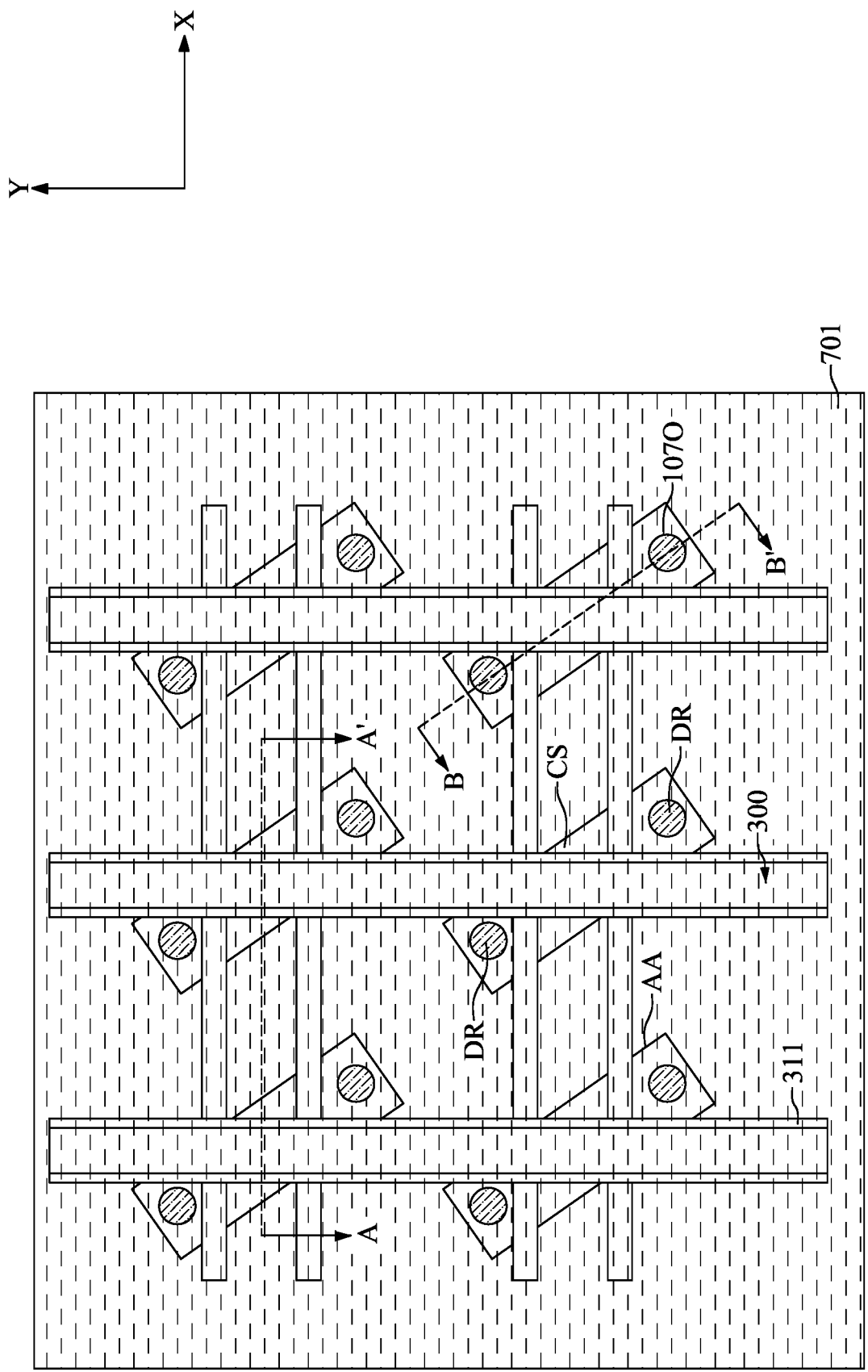
FIG. 18 illustrates, in a schematic top-view diagram, an intermediate semiconductor device in accordance with one embodiment of the present disclosure.
Figure 19:
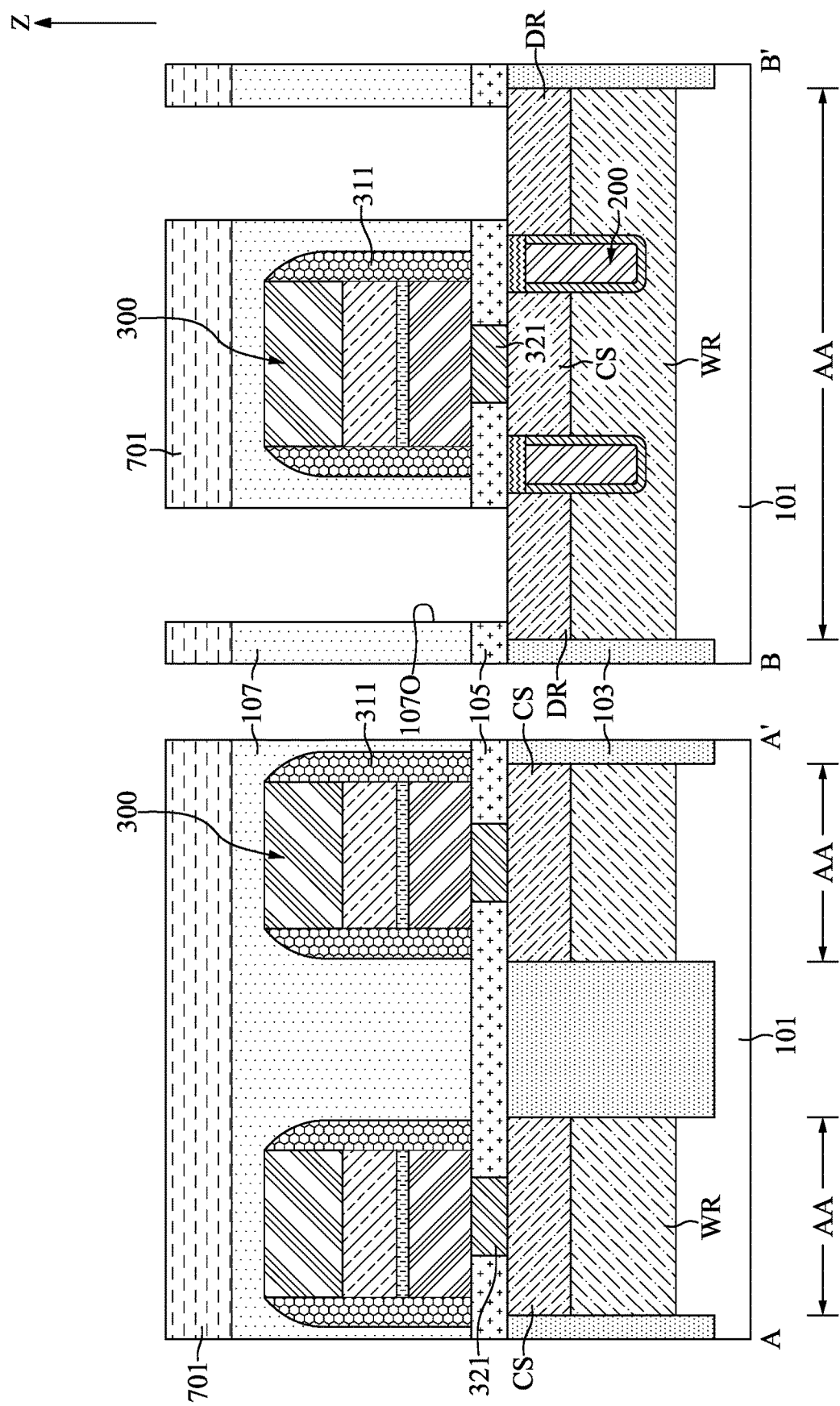
FIGS. 19 and 20 are schematic cross-sectional view diagrams taken along lines A-A' and B-B' in FIG. 18 illustrating part of the flow for fabricating the semiconductor device in accordance with one embodiment of the present disclosure.
Figure 20:
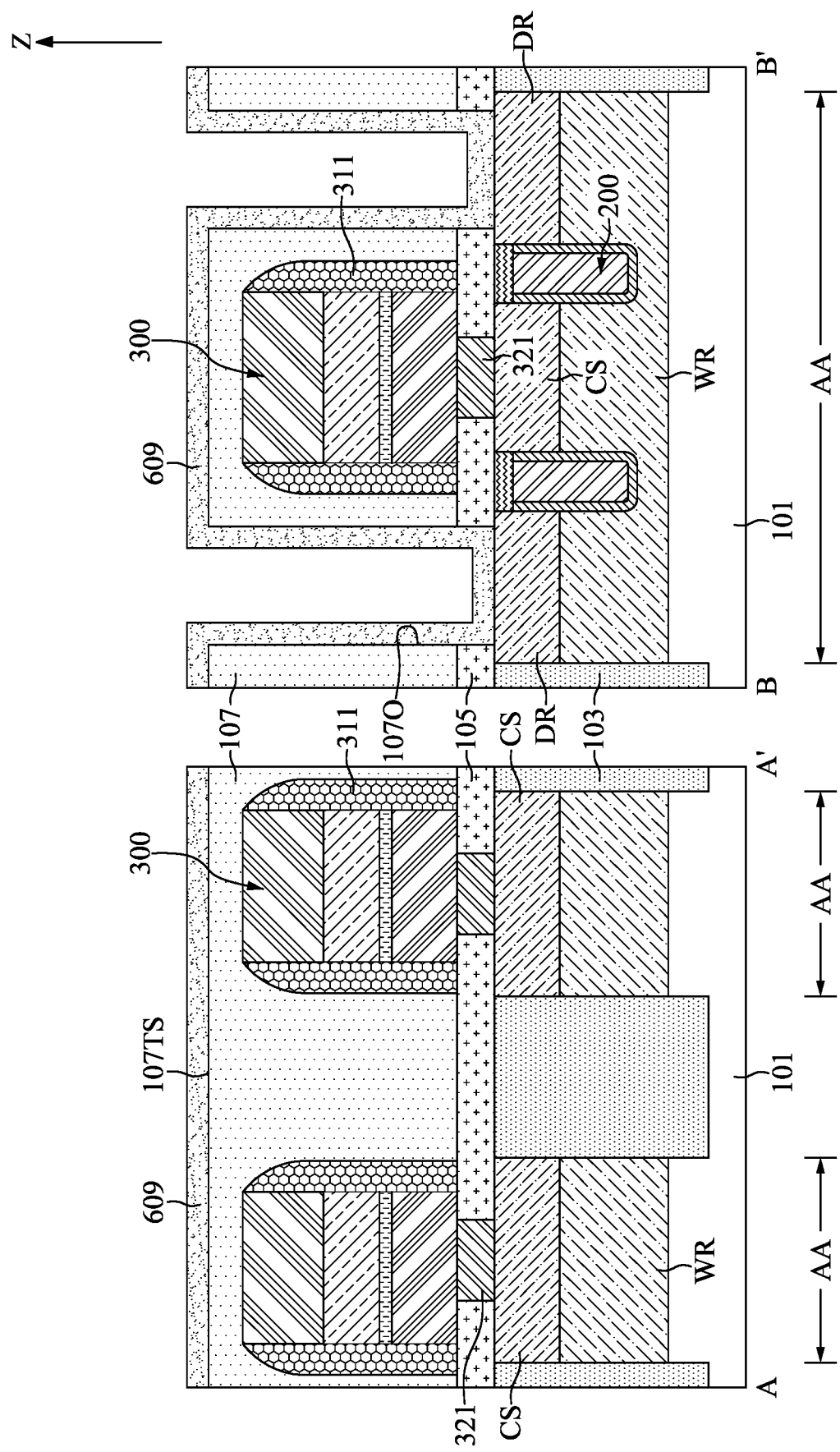
Figure 21:
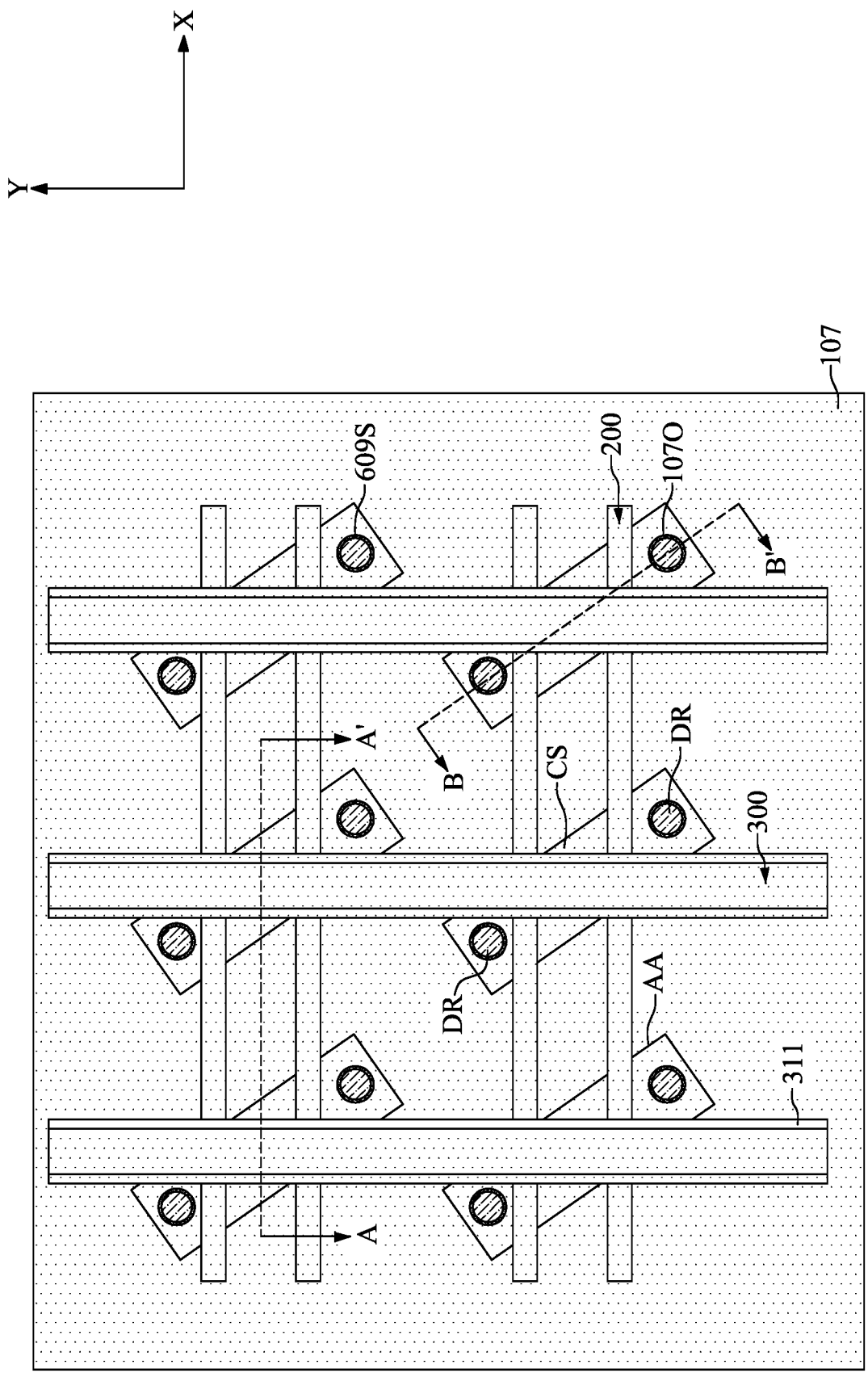
FIG. 21 illustrates, in a schematic top-view diagram, an intermediate semiconductor device in accordance with one embodiment of the present disclosure.
Figure 22:
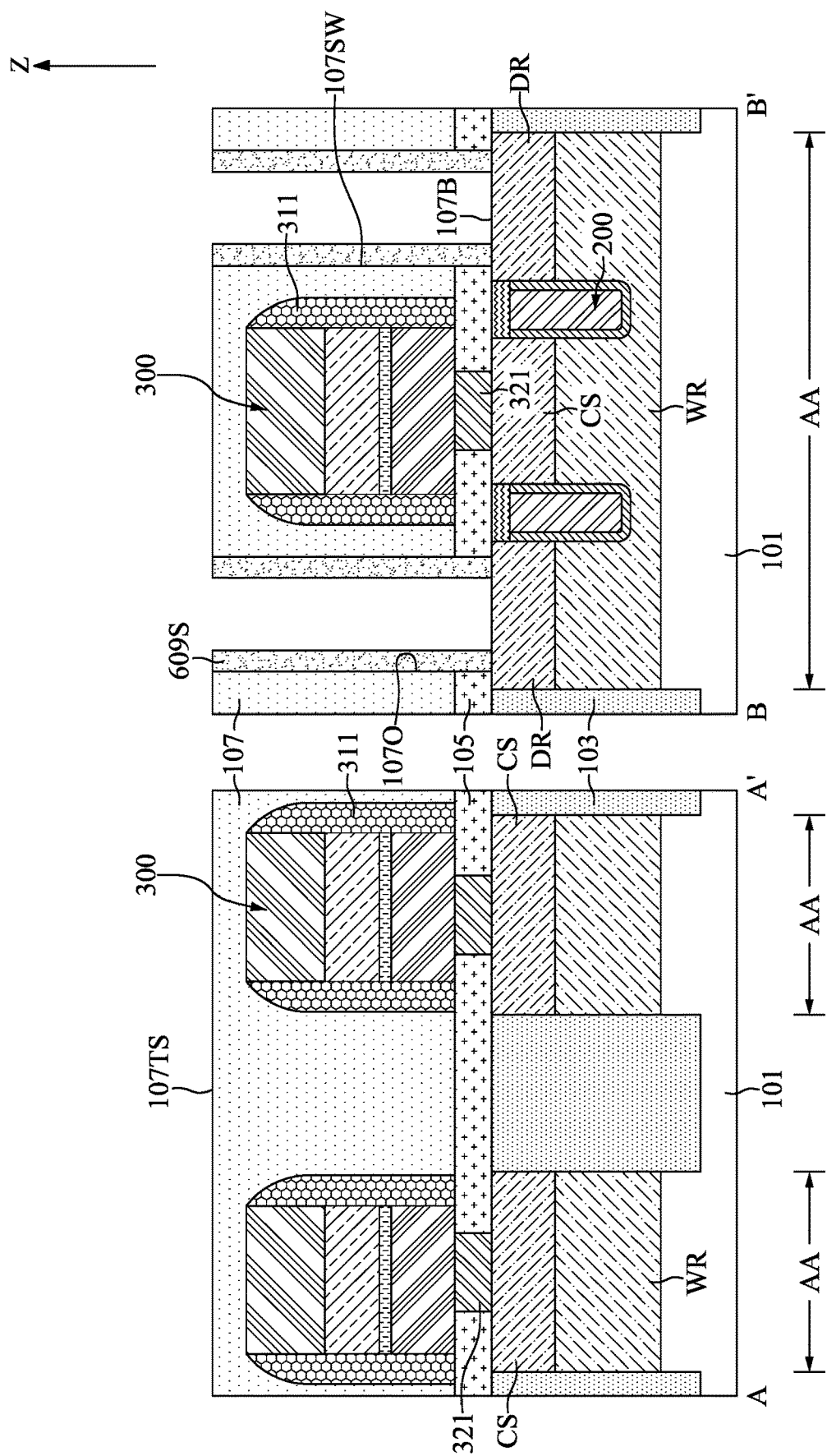
FIGS. 22 and 23 are schematic cross-sectional view diagrams taken along lines A-A' and B-B' in FIG. 21 illustrating part of the flow for fabricating the semiconductor device in accordance with one embodiment of the present disclosure.
Figure 23:
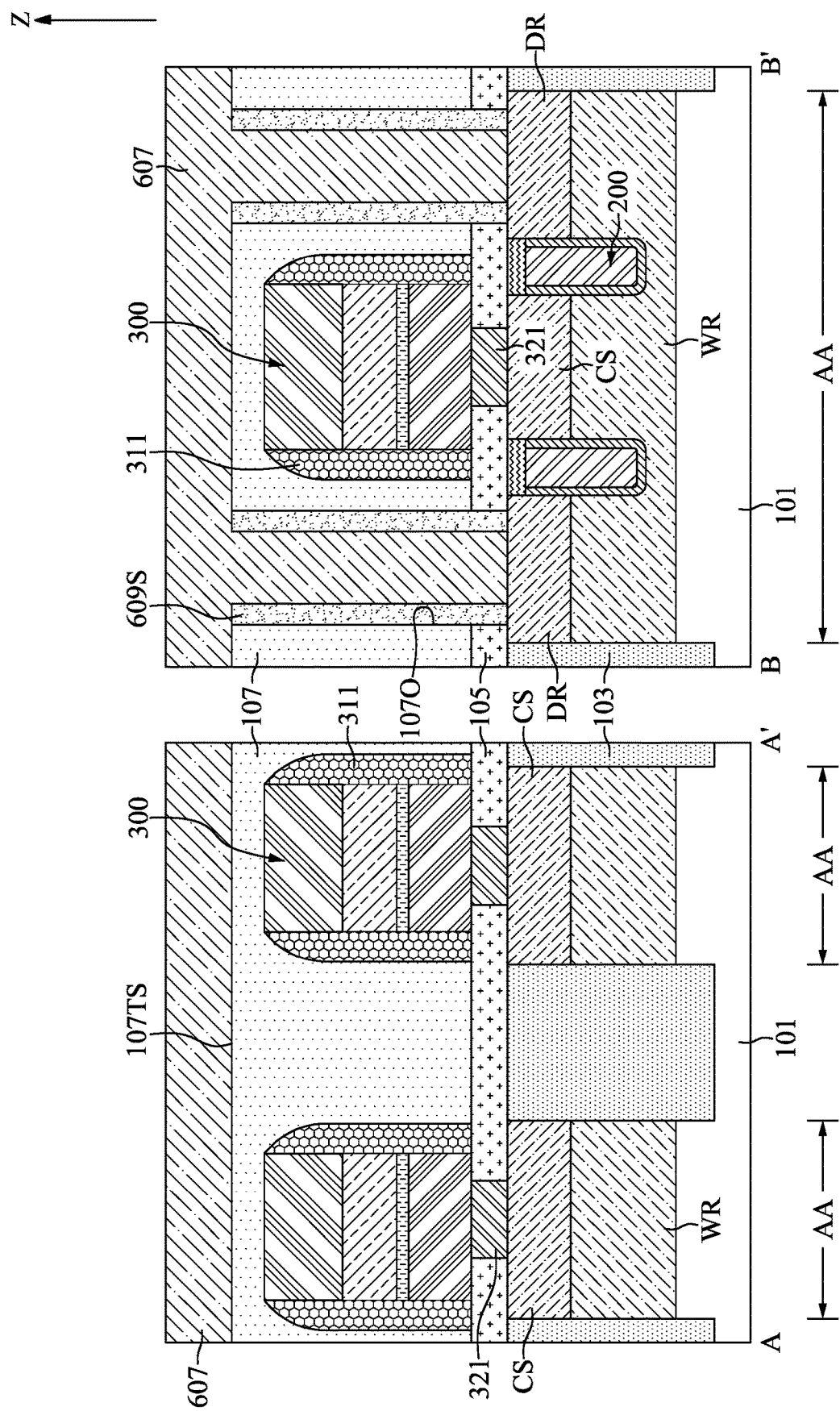
Figure 24:
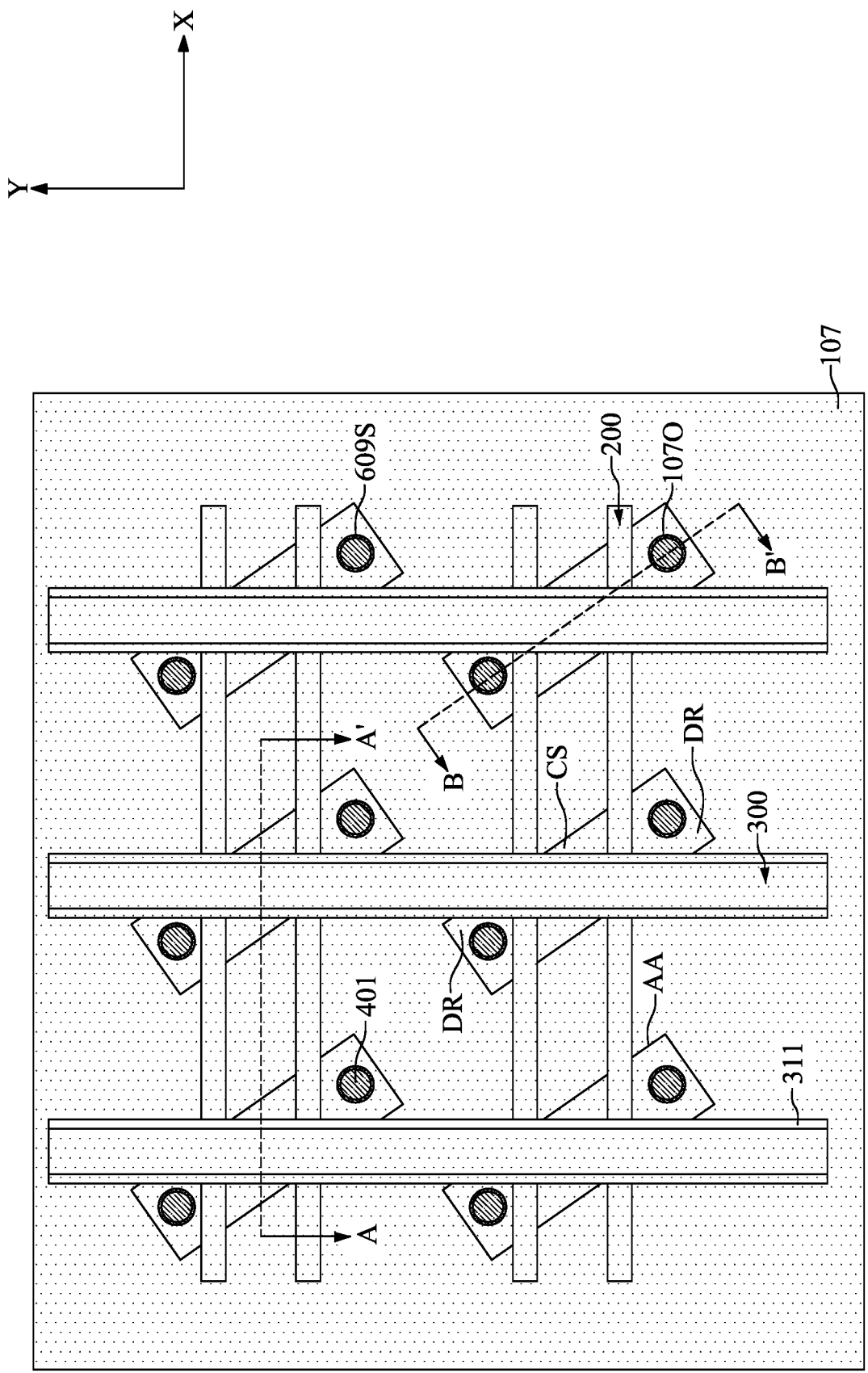
FIG. 24 illustrates, in a schematic top-view diagram, an intermediate semiconductor device in accordance with one embodiment of the present disclosure.
Figure 25:
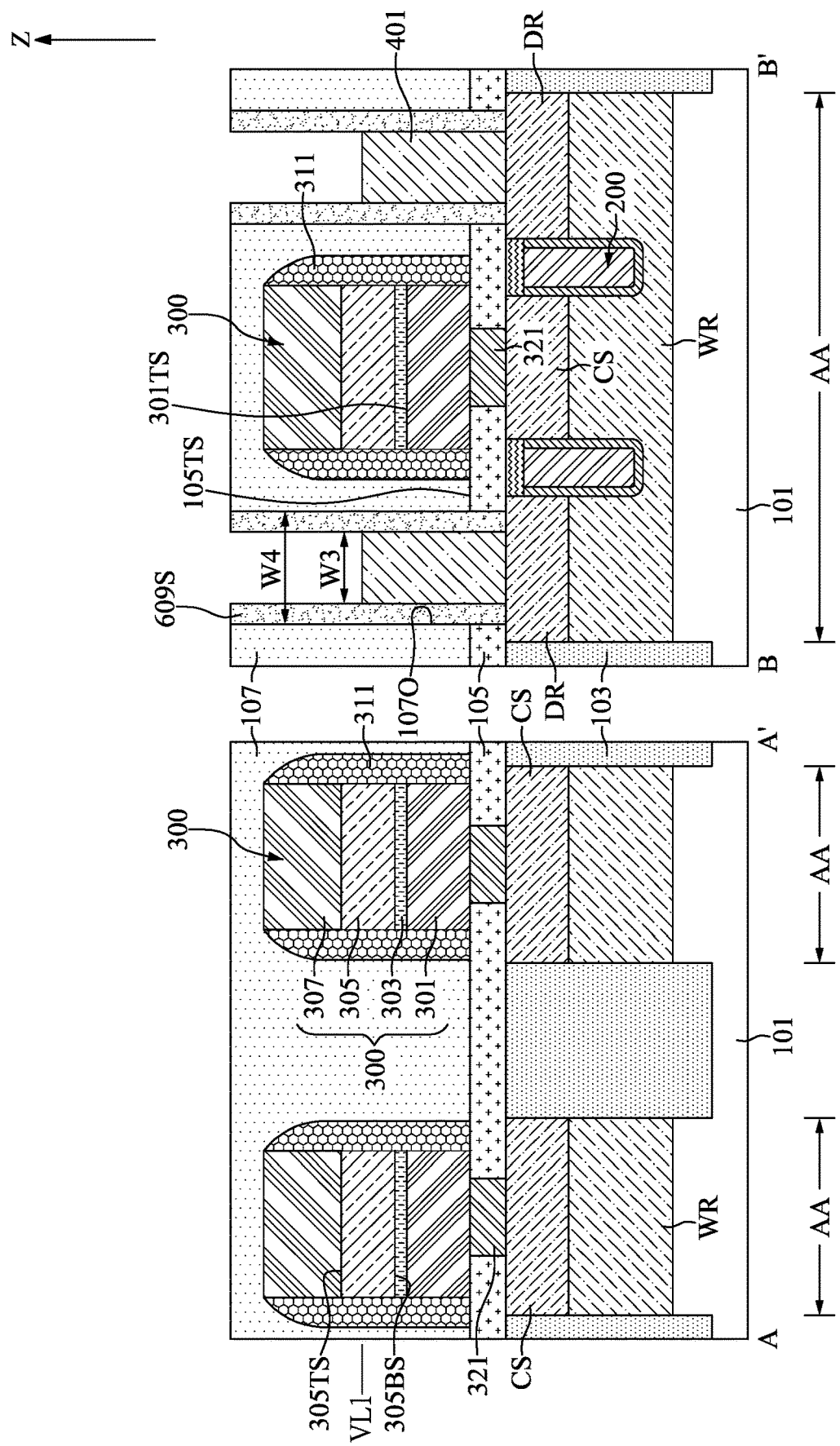
FIG. 25 is a schematic cross-sectional view diagram taken along lines A-A' and B-B' in FIG. 24.

FIG. 18 illustrates, in a schematic top-view diagram, an intermediate semiconductor device in accordance with one embodiment of the present disclosure. FIGS. 19 and 20 are schematic cross-sectional view diagrams taken along lines A-A' and B-B' in FIG. 18 illustrating part of the flow for fabricating the semiconductor device 1A in accordance with one embodiment of the present disclosure. FIG. 21 illustrates, in a schematic top-view diagram, an intermediate semiconductor device in accordance with one embodiment of the present disclosure. FIGS. 22 and 23 are schematic cross-sectional view diagrams taken along lines A-A' and B-B' in FIG. 21 illustrating part of the flow for fabricating the semiconductor device 1A in accordance with one embodiment of the present disclosure. FIG. 24 illustrates, in a schematic top-view diagram, an intermediate semiconductor device in accordance with one embodiment of the present disclosure. FIG. 25 is a schematic cross-sectional view diagram taken along lines A-A' and B-B' in FIG. 24.

With reference to FIG. 1 and FIGS. 18 to 25, at step S15, a plurality of openings 107O may be formed to expose the plurality of drains DR, a plurality of sacrificial segments 609S may be conformally formed on sidewalls 107SW of the plurality of openings 107O, and a plurality of cell contact bottom conductive layers 401 may be formed in the plurality of openings 107O.

With reference to FIGS. 18 and 19, an opening etching process may be performed using the first mask layer 701 as the mask to remove portions of the top dielectric layer 107 and the bottom dielectric layer 105. In some embodiments, the opening etching process may be a multi-stage etching process. For example, the opening etching process may be a two-stage anisotropic dry etching process. The etching chemistry may be different for each stage to provide different etching selectivity.

In some embodiments, the etch rate ratio of the top dielectric layer 107 to the first mask layer 701 may be between about 100:1 and about 1.05:1, between about 15:1 and about 2:1, or between about 10:1 and about 2:1 during the first stage of the opening etching process. In some embodiments, the etch rate ratio of the top dielectric layer 107 to the bottom dielectric layer 105 may be between about 100:1 and about 1.05:1, between about 15:1 and about 2:1, or between about 10:1 and about 2:1 during the first stage of the opening etching process.

In some embodiments, the etch rate ratio of the bottom dielectric layer 105 to the first mask layer 701 may be between about 100:1 and about 1.05:1, between about 15:1 and about 2:1, or between about 10:1 and about 2:1 during the second stage of the opening etching process. In some embodiments, the etch rate ratio of the bottom dielectric layer 105 to the drain DR may be between about 100:1 and about 1.05:1, between about 15:1 and about 2:1, or between about 10:1 and about 2:1 during the second stage of the opening etching process.

After the opening etching process, the plurality of openings 107O may be formed along the top dielectric layer 107 and the bottom dielectric layer 105. The plurality of drains DR may be exposed through the plurality of openings 107O, respectively and correspondingly. The first mask layer 701 may be removed after the plurality of openings 107O are formed. In some embodiments, the plurality of openings 107O may have a circle-shaped cross-sectional profile in a top-view perspective but is not limited to that shape. In some embodiments, the plurality of openings 107O may have a rectangle-shaped, a square-shaped, or other applicable shaped cross-sectional profile in a top-view perspective.

With reference to FIG. 20, a sacrificial layer 609 may be conformally formed on the top surface 107TS of the top dielectric layer 107 and in the plurality of openings 107O. In some embodiments, the sacrificial layer 609 may be formed of a material having etching selectivity with respect to the top dielectric layer 107. In some embodiments, the sacrificial layer 609 may be formed of doped oxide such as borosilica glass, phosphosilica glass, borophosphosilica glass, fluoride silicate glass, carbon doped silicon oxide, or the like. In some embodiments, the sacrificial layer 609 may be formed of a thermal decomposable polymer or a thermal degradable polymer. The thermal decomposable polymer or the thermal degradable polymer decomposes or degrades into a gaseous state when exposed to a temperature exceeding the decomposition temperature of the thermal decomposable polymer or the degradation temperature of the thermal degradable polymer. In some embodiments, the sacrificial layer 609 may be formed by, for example, atomic layer deposition, chemical vapor deposition, or other applicable deposition processes. The plurality of drains DR may be covered by the sacrificial layer 609 in the current stage.

With reference to FIGS. 21 and 22, a first punch etching process may be performed to remove portions of the sacrificial layer 609. Detailedly, the sacrificial layer 609 formed on the top surface 107TS of the top dielectric layer 107 and the bottom 107B of the opening 107O may be removed. In some embodiments, the first punch etching process may be an anisotropic etching process such as an anisotropic dry etching process or reactive ion etching. In some embodiments, the etch rate ratio of the sacrificial layer 609 to the top dielectric layer 107 may be between about 100:1 and about 1.05:1, between about 15:1 and about 2:1, or between about 10:1 and about 2:1 during the first punch etching process. In some embodiments, the etch rate ratio of the sacrificial layer 609 to the drain DR may be between about 100:1 and about 1.05:1, between about 15:1 and about 2:1, or between about 10:1 and about 2:1 during the first punch etching process. After the first punch etching process, the remaining sacrificial layer 609 may be turned into the plurality of sacrificial segments 609S.

With reference to FIGS. 21 and 22, the plurality of sacrificial segments 609S may be formed on the sidewalls 107SW of the plurality of openings 107O, respectively and correspondingly. The plurality of sacrificial segments 609S may have a ring-shaped cross-sectional profile in a top-view perspective but is not limited to that shape. The shape of the sacrificial segment 609S in a top-view perspective may be determined by the shape of the opening 107O in a top-view perspective. The plurality of drains DR may be partially exposed in the current stage.

With reference to FIG. 23, a layer of fourth conductive material 607 may be formed on the top surface 107TS of the top dielectric layer 107 and may completely fill the plurality of openings 107O. A planarization process, such as chemical mechanical polishing, may be performed to remove excess material and provide a substantially flat surface for subsequent processing steps. In some embodiments, the fourth conductive material 607 may be, for example, polycrystalline silicon, polycrystalline germanium, polycrystalline silicon germanium, doped polycrystalline silicon, doped polycrystalline germanium, doped polycrystalline silicon germanium, or a combination thereof. In some embodiments, the dopants for the fourth conductive material 607 may include boron, aluminum, gallium, indium, antimony, arsenic, or phosphorus. In some embodiments, the layer of fourth conductive material 607 may be formed by, for example, chemical vapor deposition or other applicable deposition processes.

With reference to FIGS. 24 and 25, an etching back process may be performed to remove portions of the fourth conductive material 607. In some embodiments, the etch rate ratio of the fourth conductive material 607 to the top dielectric layer 107 may be between about 100:1 and about 1.05:1, between about 15:1 and about 2:1, or between about 10:1 and about 2:1 during the etching back process. In some embodiments, the etch rate ratio of the fourth conductive material 607 to the plurality of sacrificial segments 609S may be between about 100:1 and about 1.05:1, between about 15:1 and about 2:1, or between about 10:1 and about 2:1 during the etching back process. After the etching back process, the remaining fourth conductive material 607 may be referred to as the plurality of cell contact bottom conductive layers 401. The plurality of cell contact bottom conductive layers 401 may be formed in the plurality of openings 107O, respectively and correspondingly. The plurality of the cell contact bottom conductive layers 401 may be surrounded by the plurality of sacrificial segments 609S, respectively and correspondingly.

For brevity, clarity, and convenience of description, only one cell contact bottom conductive layer 401 is described.

Figure 28:
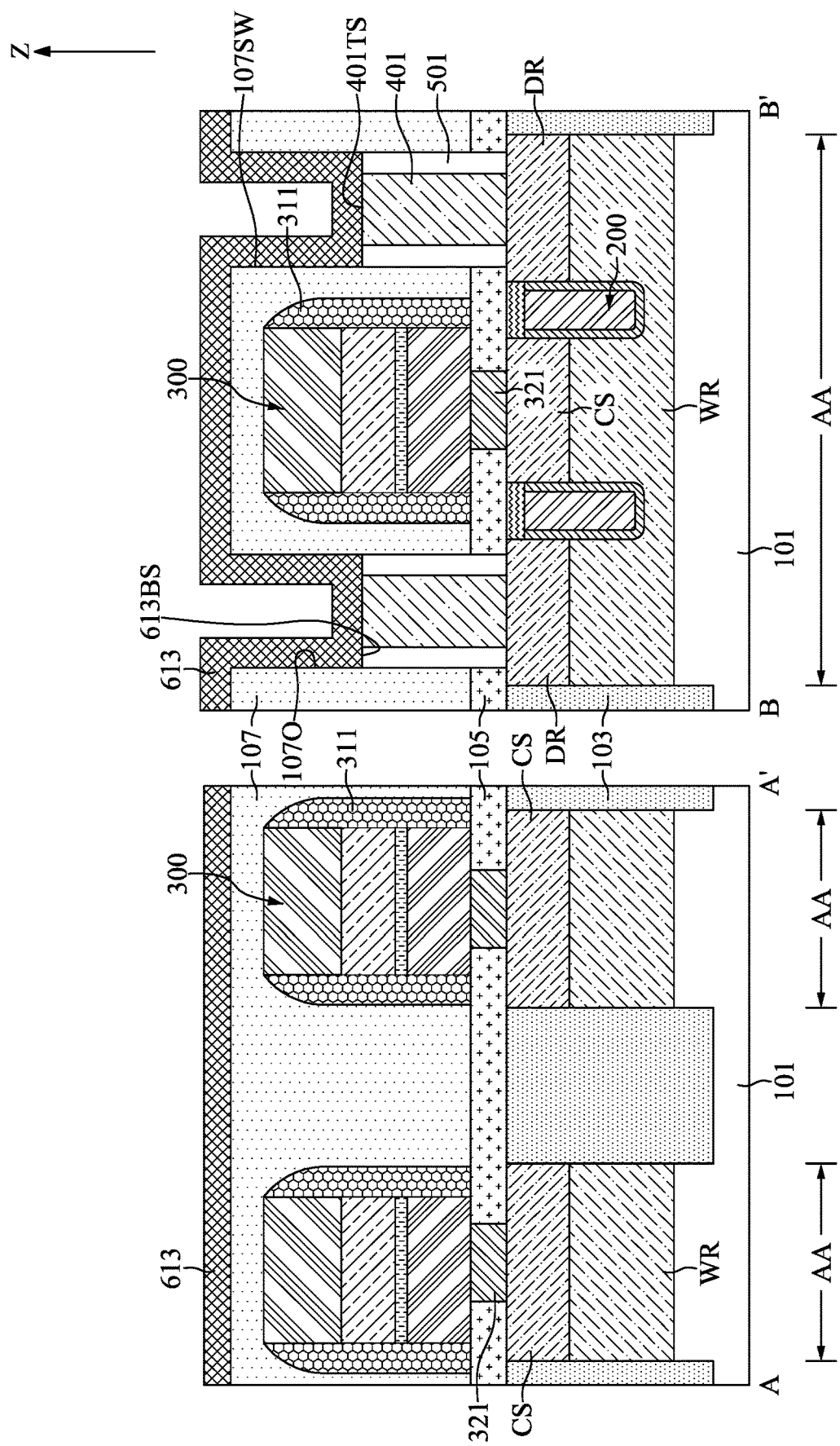

With reference to FIG. 25, in some embodiments, the top surface 401TS of the cell contact bottom conductive layer 401 may be at a vertical level VLI between the top surface 305TS of the bit line top conductive layer 305 and the bottom surface 305BS of the bit line top conductive layer 305. Alternatively, in some embodiments, the top surface 401TS (as shown in FIG. 28) of the cell contact bottom conductive layer 401 may be at a vertical level between the top surface 301TS of the bit line bottom conductive layer 301 and the top surface 105TS of the bottom dielectric layer 105. In some embodiments, the width ratio of the width W3 of the cell contact bottom conductive layer 401 to the width W4 of the opening 107O may be between about 0.5 and about 0.95 or between about 0.6 and about 0.85. It should be noted that a cell contact structure 400, which will be illustrated later, may be formed in the opening 107O. Therefore, the width W4 of the opening 107O may be inherited by the cell contact structure 400.

Figure 26:
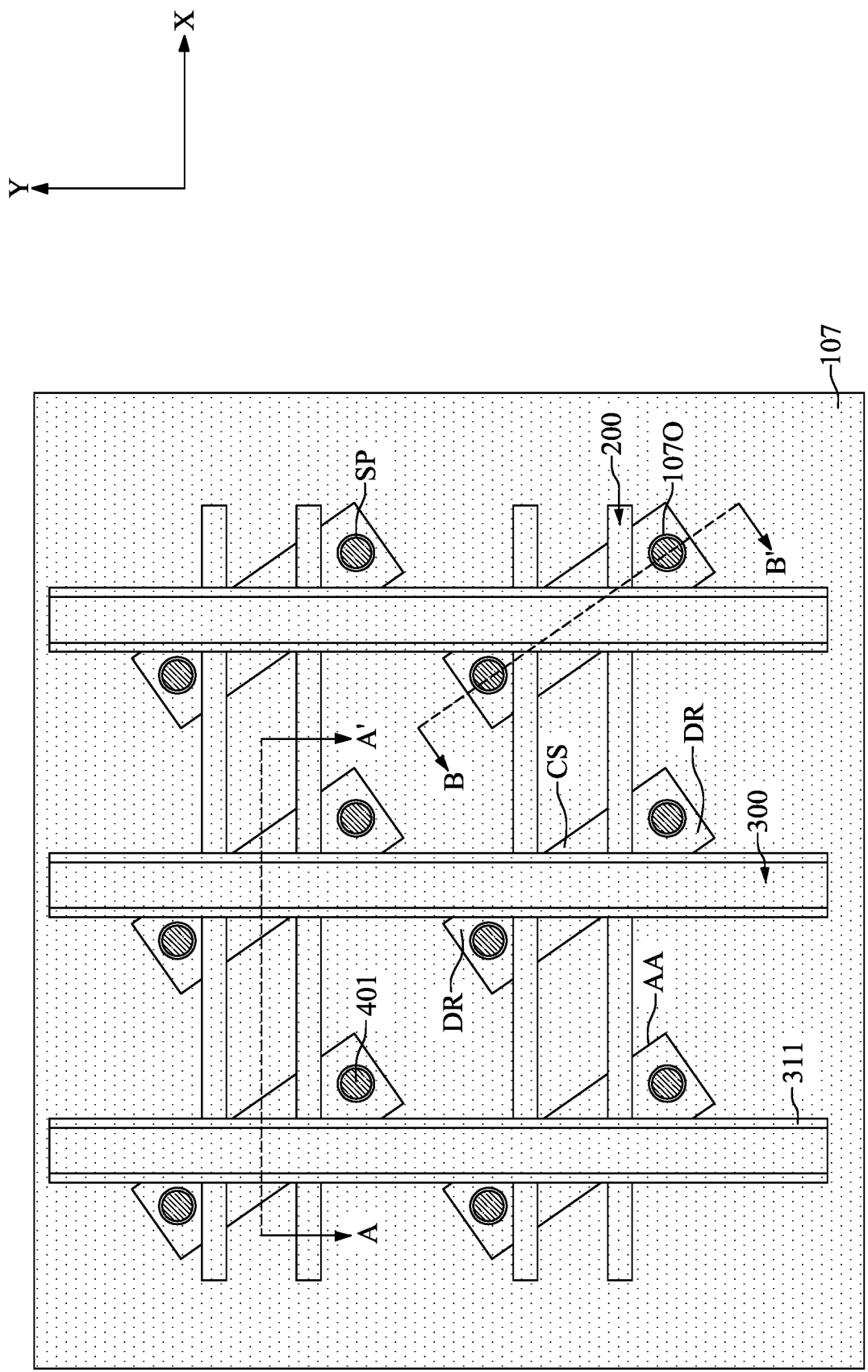
FIG. 26 illustrates, in a schematic top-view diagram, an intermediate semiconductor device in accordance with one embodiment of the present disclosure.
Figure 27:
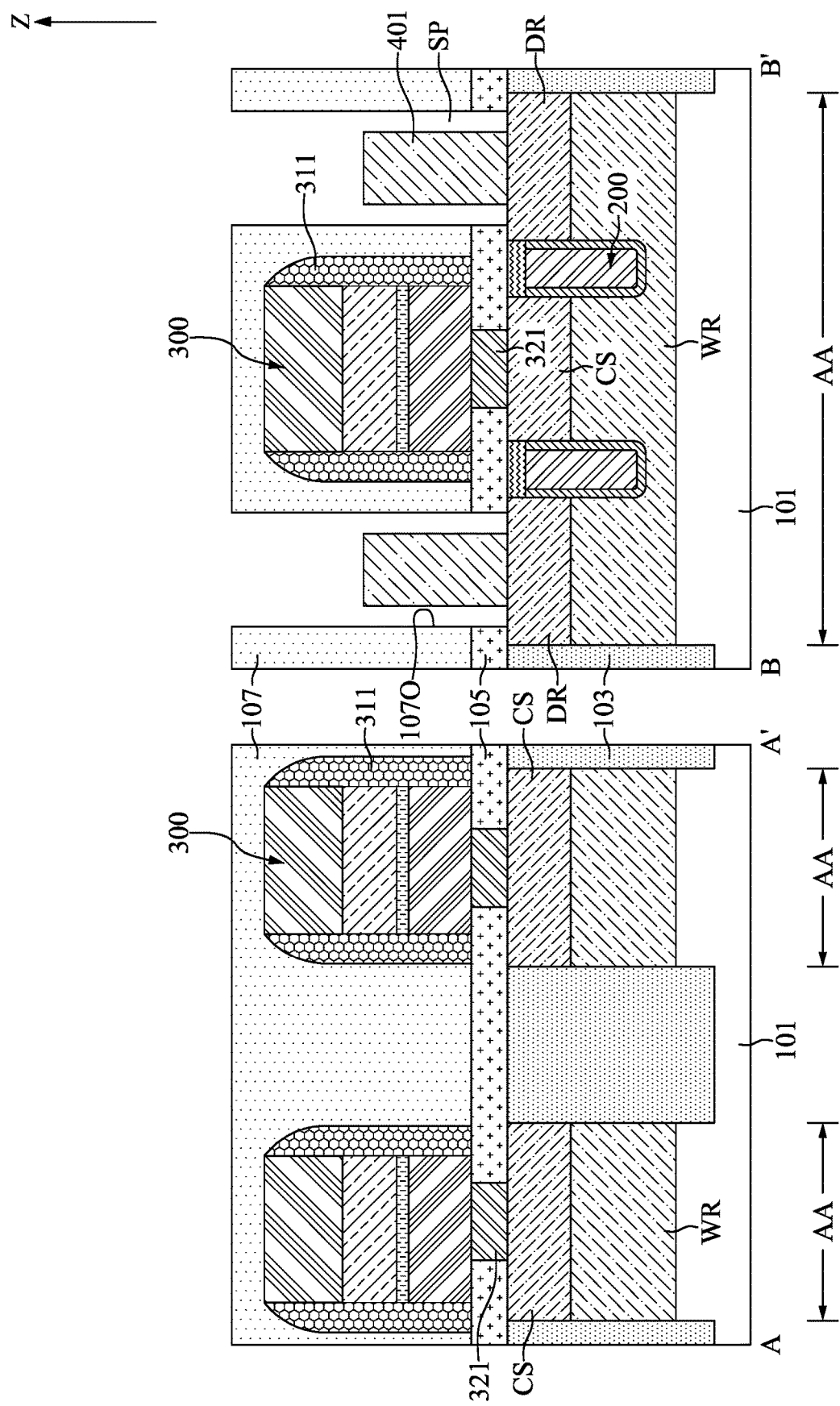
FIGS. 27 and 28 are schematic cross-sectional view diagrams taken along lines A-A' and B-B' in FIG. 26 illustrating part of the flow for fabricating the semiconductor device in accordance with one embodiment of the present disclosure.
Figure 29:
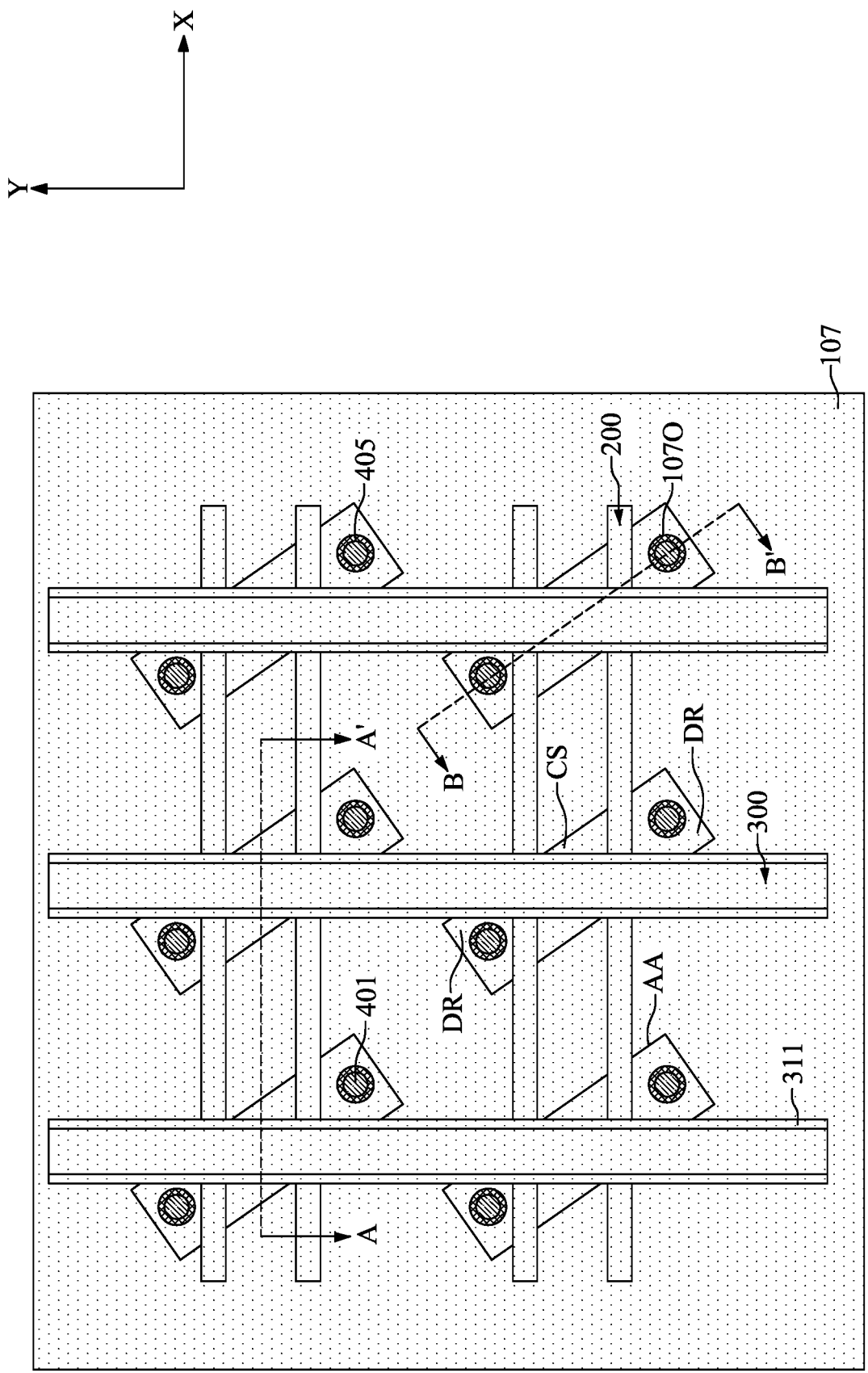
FIG. 29 illustrates, in a schematic top-view diagram, an intermediate semiconductor device in accordance with one embodiment of the present disclosure.
Figure 30:
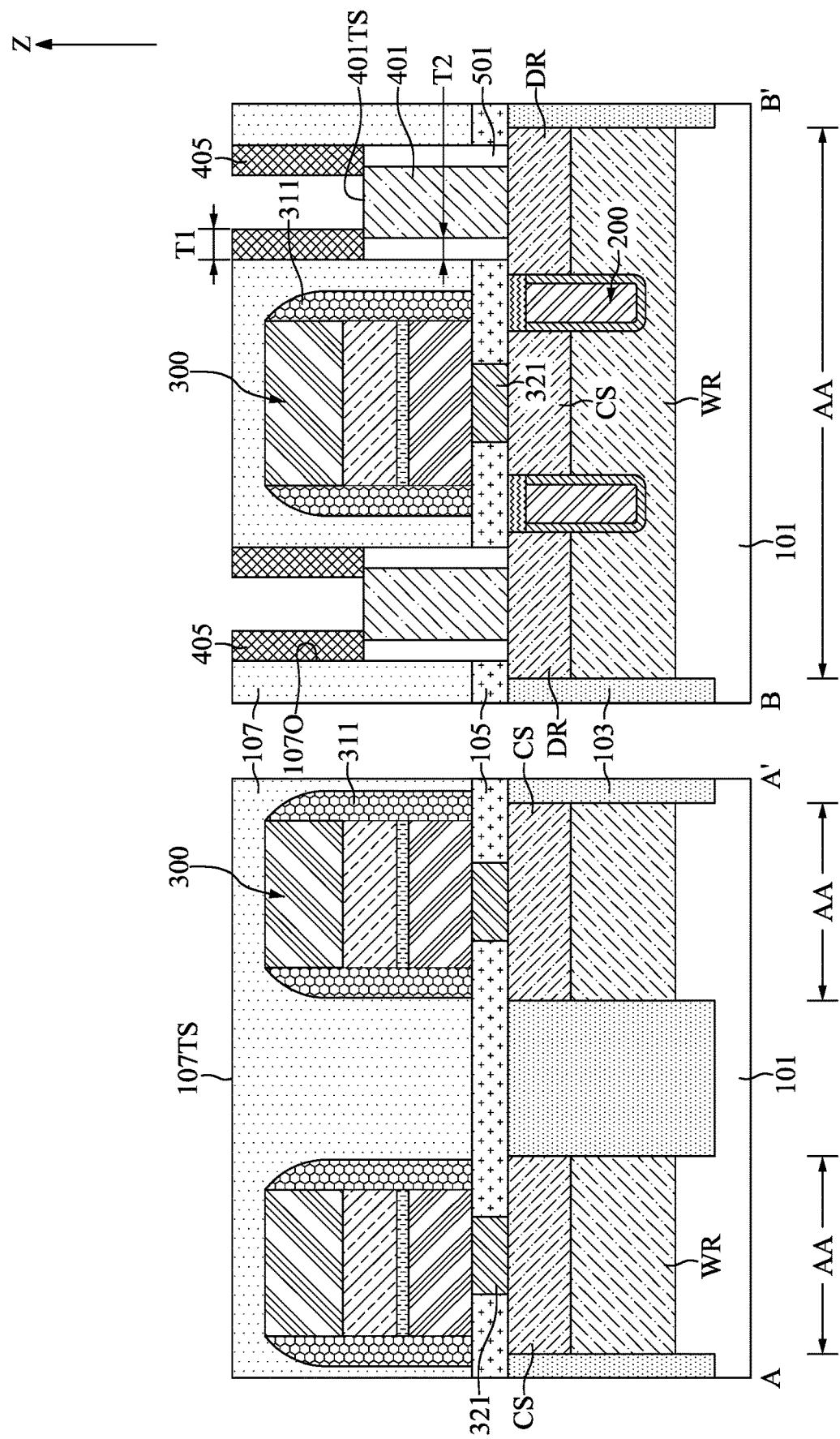
FIG. 30 is a schematic cross-sectional view diagram taken along lines A-A' and B-B' in FIG. 29.
Figure 31:
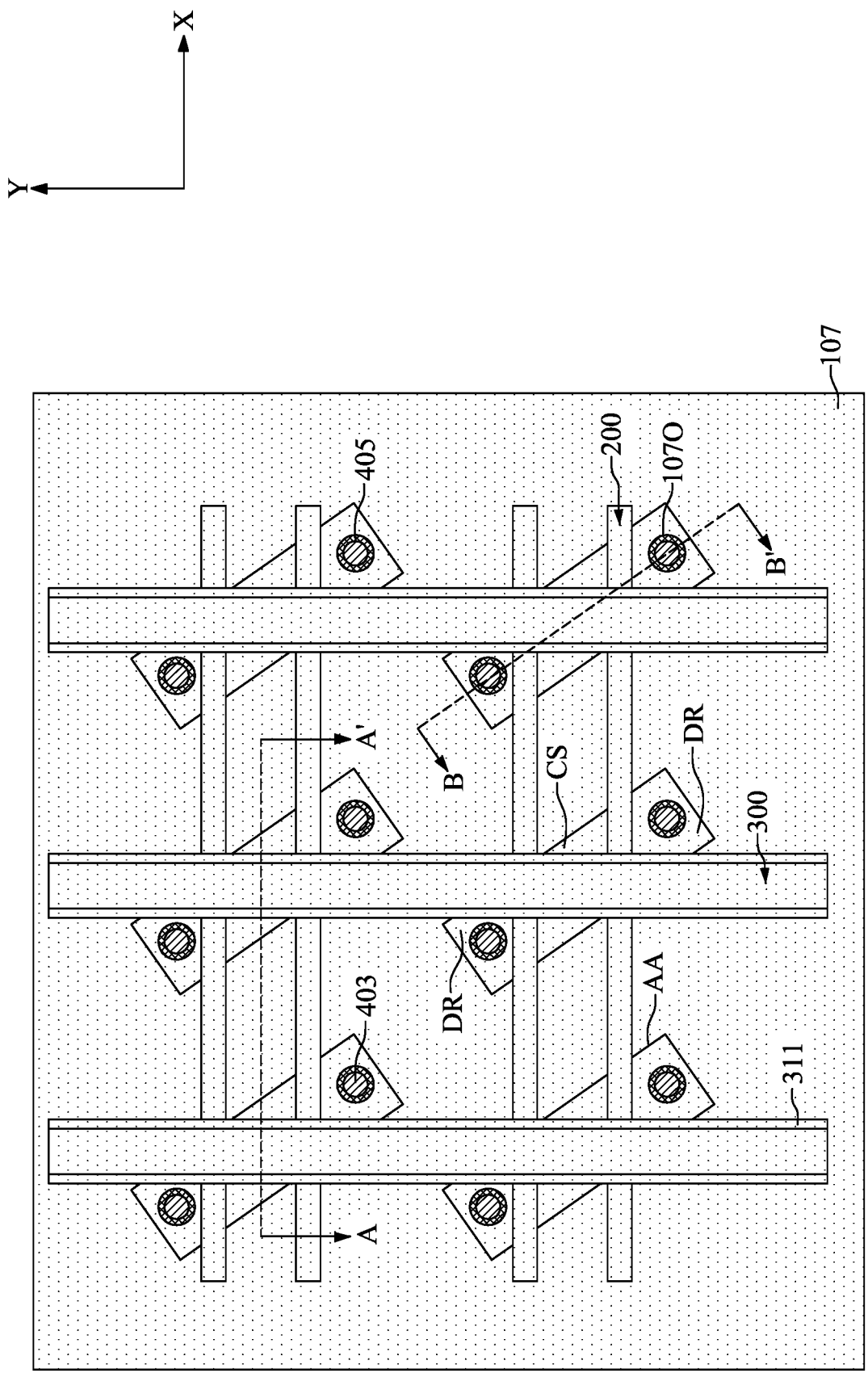
FIG. 31 illustrates, in a schematic top-view diagram, an intermediate semiconductor device in accordance with one embodiment of the present disclosure.
Figure 32:
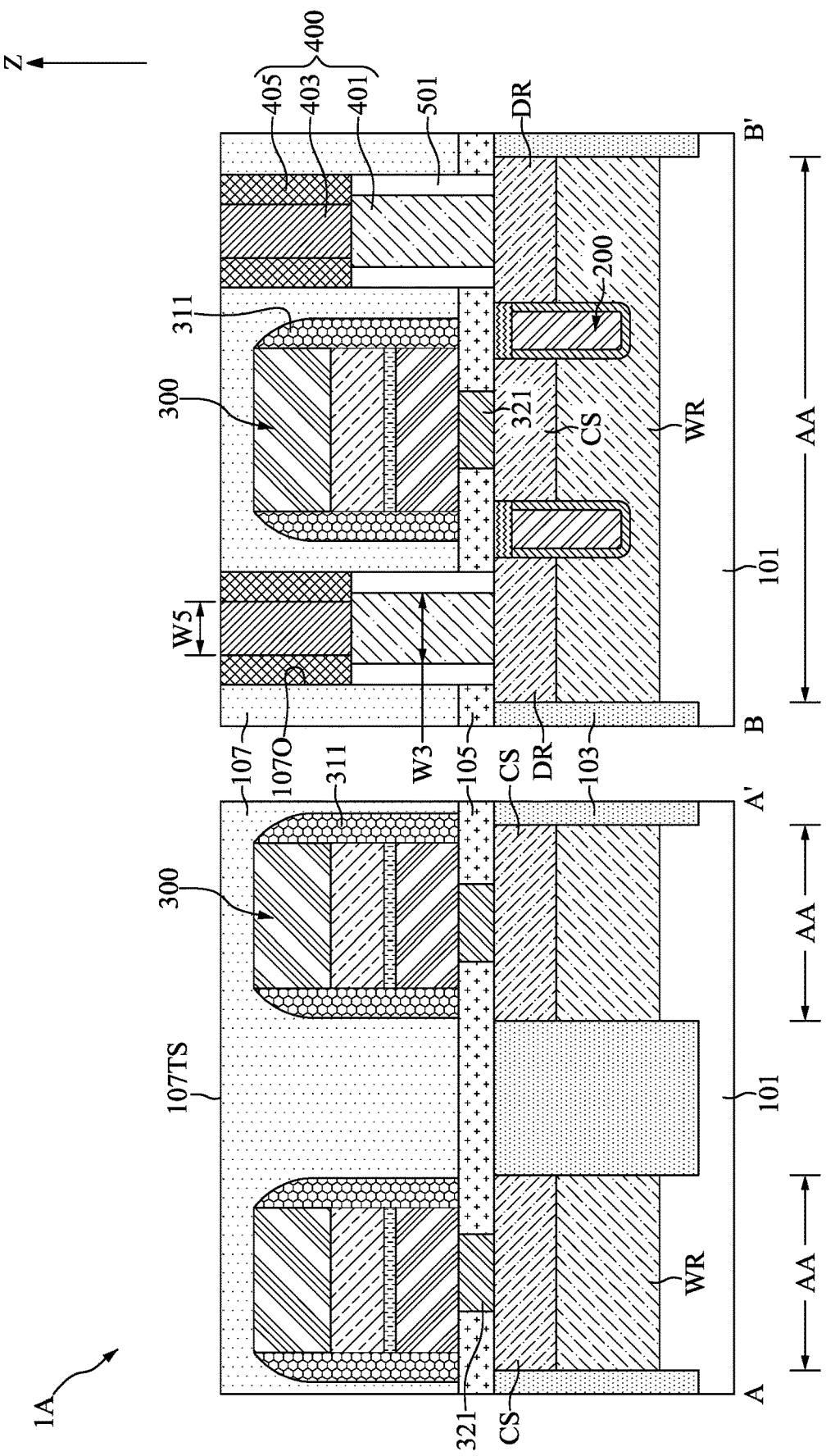
FIG. 32 is a schematic cross-sectional view diagram taken along lines A-A' and B-B' in FIG. 31.

FIG. 26 illustrates, in a schematic top-view diagram, an intermediate semiconductor device in accordance with one embodiment of the present disclosure. FIGS. 27 and 28 are schematic cross-sectional view diagrams taken along lines A-A' and B-B' in FIG. 26 illustrating part of the flow for fabricating the semiconductor device 1A in accordance with one embodiment of the present disclosure. FIG. 29 illustrates, in a schematic top-view diagram, an intermediate semiconductor device in accordance with one embodiment of the present disclosure. FIG. 30 is a schematic cross-sectional view diagram taken along lines A-A' and B-B' in FIG. 29. FIG. 31 illustrates, in a schematic top-view diagram, an intermediate semiconductor device in accordance with one embodiment of the present disclosure. FIG. 32 is a schematic cross-sectional view diagram taken along lines A-A' and B-B' in FIG. 31.

With reference to FIG. 1 and FIGS. 26 to 32, at step S17, the plurality of sacrificial segments 609S may be removed to form a plurality of spaces SP surrounding the plurality of cell contact bottom conductive layers 401, a plurality of cell contact top sealing layers 405 may be formed to seal the plurality of spaces SP and concurrently form a plurality of first air gaps 501, and a plurality of cell contact top conductive layers 403 may be formed on the plurality of cell contact bottom conductive layers 401 to configure a plurality of cell contact structures 400.

With reference to FIGS. 26 and 27, a removal process may be performed to remove the plurality of sacrificial segments 609S and form (or creating) the plurality of spaces SP (or gaps) that surround the plurality of cell contact bottom conductive layer 401, respectively and correspondingly. In some embodiments, the plurality of spaces SP may have a ring-shaped cross-sectional profile in a top-view perspective but is not limited to that shape. The shape of the space SP in a top-view perspective may be determined by the shape of the opening 107O in a top-view perspective.

In some embodiments, the removal process may involve a vapor etching. For instance, vapor hydrogen fluoride can be used to remove the plurality of sacrificial segments 609S, thereby forming the plurality of spaces SP in situ. The vapor hydrogen fluoride exhibits a higher etching rate on the doped oxide sacrificial segments 609S due to the density difference between them and the undoped oxide top dielectric layer 107 and the bottom dielectric layer 105. Consequently, the vapor hydrogen fluoride selectively removes the doped oxide sacrificial segments 609S while leaving the undoped oxide top dielectric layer 107 and the bottom dielectric layer 105 intact.

In some embodiments, the removal process may involve a heating process. The intermediate semiconductor device illustrated in FIG. 25 may be heated to decompose or degrade the plurality of sacrificial segments 609S formed of thermal decomposable polymer or thermal degradable polymer. A temperature of the heat process may be about 300° C. to about 450° C. In some embodiments, the temperature of the heat process may be about 350° C. to about 420° C.

With reference to FIG. 28, a layer of sealing material 613 may be conformally formed on the top surface 107TS of the top dielectric layer 107, on the plurality of cell contact bottom conductive layers 401, and on the upper portions of the sidewalls 107SW of the plurality of openings 107O. The layer of sealing material 613 may seal the plurality of spaces SP and transform the sealed spaces into the plurality of first air gaps 501. In some embodiments, the bottom surface 613BS of the layer of sealing material 613 may be at a vertical level substantially coplanar with the top surface 401TS of the cell contact bottom conductive layer 401. In some embodiments, the sealing material 613 may flow downward toward the bottom dielectric layer 105. This means that the bottom surface 613BS of the sealing material layer 613 may be disposed at a lower vertical level compared to the top surface 401TS of the cell contact bottom conductive layer 401 (not shown in FIG. 28). Even in this scenario, where the sealing material 613 flows downward, there may still be remaining unfilled space to configure the first air gap 501.

In a top-view perspective, the shape of the cross-sectional profile of the plurality of first air gaps 501 may be determined by the shape of the cross-sectional profile of the plurality of spaces SP. Thai is, the plurality of first air gaps 501 may have a have a ring-shaped cross-sectional profile or other applicable shaped cross-sectional profile.

In some embodiments, the sealing material 613 may be, for example, silicon oxide, silicon nitride, or other applicable dielectric materials.

With reference to FIGS. 29 and 30, a second punch etching process may be performed to remove portions of the sealing material 613. Detailedly, the sealing material 613 formed on the top surface 107TS of the top dielectric layer 107 may be completely removed. Additionally, the sealing material 613 formed on the top surface 401TS of the cell contact bottom conductive layer 401 may be partially removed. This partial removal allows the remaining sealing material 613 to continue sealing the plurality of first air gaps 501, while partially exposing the top surface 401TS of the cell contact bottom conductive layer 401.

In some embodiments, the second punch etching process may be an anisotropic etching process such as an anisotropic dry etching process or reactive ion etching. In some embodiments, the etch rate ratio of the sealing material 613 to the top dielectric layer 107 may be between about 100:1 and about 1.05:1, between about 15:1 and about 2:1, or between about 10:1 and about 2:1 during the second punch etching process. In some embodiments, the etch rate ratio of the sealing material 613 to the cell contact bottom conductive layer 401 may be between about 100:1 and about 1.05:1, between about 15:1 and about 2:1, or between about 10:1 and about 2:1 during the second punch etching process.

After the second punch etching process, the remaining sealing material 613 may be referred to as the plurality of cell contact top sealing layers 405. For brevity, clarity, and convenience of description, only one cell contact top sealing layer 405 is described. In some embodiments, the thickness T1 of the cell contact top sealing layer 405 may be greater than the thickness T2 of the first air gap 501. In some embodiments, the cell contact top sealing layer 405 may have a ring-shaped cross-sectional profile in a top-view perspective but is not limited to that shape. The shape of the cell contact top sealing layer 405 in a top-view perspective may be determined by the shape of the opening 107O in a top-view perspective.

With reference to FIGS. 31 and 32, a plurality of cell contact top conductive layers 403 may be formed on the plurality of cell contact bottom conductive layers 401, respectively and correspondingly. The plurality of cell contact top conductive layers 403 may be surrounded by the plurality of cell contact top sealing layers 405. For brevity, clarity, and convenience of description, only one cell contact top conductive layer 403 is described. In some embodiments, the width W5 of the cell contact top conductive layer 403 may be less than the width W3 of the cell contact bottom conductive layer 401. The cell contact top conductive layer 403 may be electrically coupled to the drain DR through the cell contact bottom conductive layer 401 and may electrically connect to a capacitor (not shown). In some embodiments, the cell contact top conductive layer 403 may have a circle-shaped cross-sectional profile in a top-view perspective but is not limited to that shape. The shape of the cell contact top sealing layer 405 in a top-view perspective may be determined by the shape of the opening 107O in a top-view perspective. In some embodiments, the cell contact top conductive layer 403 may be formed by completely filling the opening 107O with a conductive material; subsequently, a planarization process may be performed until the top surface 107TS of the top dielectric layer 107 is exposed. In some embodiments, the conductive material may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

With reference to FIGS. 31 and 32, the cell contact bottom conductive layer 401, the cell contact top conductive layer 403, and the cell contact top sealing layer 405 together configure the cell contact structure 400.

Due to the presence of the plurality of first air gaps 501, the parasitic capacitance between conductive features (e.g., the plurality of bit line structures 300 and the plurality of cell contact structures 400) may be reduced. As a result, the performance of the semiconductor device 1A may be improved.

FIGS. 33 to 36 are schematic cross-sectional view diagrams illustrating part of a flow for fabricating a semiconductor device 1B in accordance with another embodiment of the present disclosure.

Figure 33:
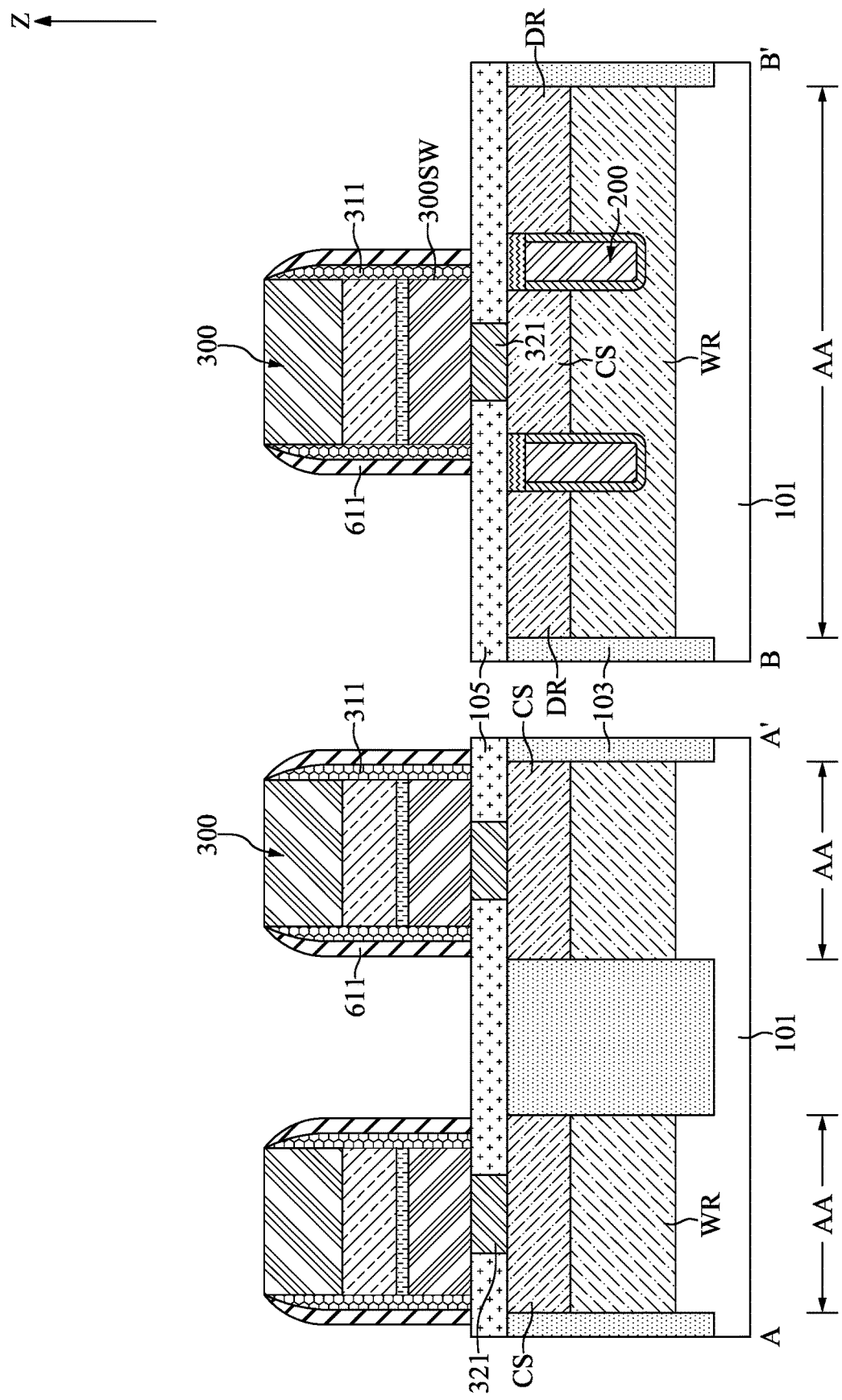
FIGS. 33 to 36 are schematic cross-sectional view diagrams illustrating part of a flow for fabricating a semiconductor device in accordance with another embodiment of the present disclosure.

With reference to FIG. 33, an intermediate semiconductor device may be fabricated with a procedure similar to that illustrated in FIGS. 2 to 16, and descriptions thereof are not repeated herein. The plurality of first bit line spacers 311 may be formed of, for example, undoped oxide or silicon nitride. A plurality of sacrificial spacers 611 may be formed on the plurality of first bit line spacers 311, respectively and correspondingly. In some embodiments, the plurality of sacrificial spacers 611 may be formed of a material having etching selectivity with respect to the plurality of first bit line spacers 311. In some embodiments, the plurality of sacrificial spacers 611 may be formed of doped oxide such as borosilica glass, phosphosilica glass, borophosphosilica glass, fluoride silicate glass, carbon doped silicon oxide, or the like. In some embodiments, the plurality of sacrificial spacers 611 may be formed of a thermal decomposable polymer or a thermal degradable polymer. The thermal decomposable polymer or the thermal degradable polymer decomposes or degrades into a gaseous state when exposed to a temperature exceeding the decomposition temperature of the thermal decomposable polymer or the degradation temperature of the thermal degradable polymer.

Figure 34:
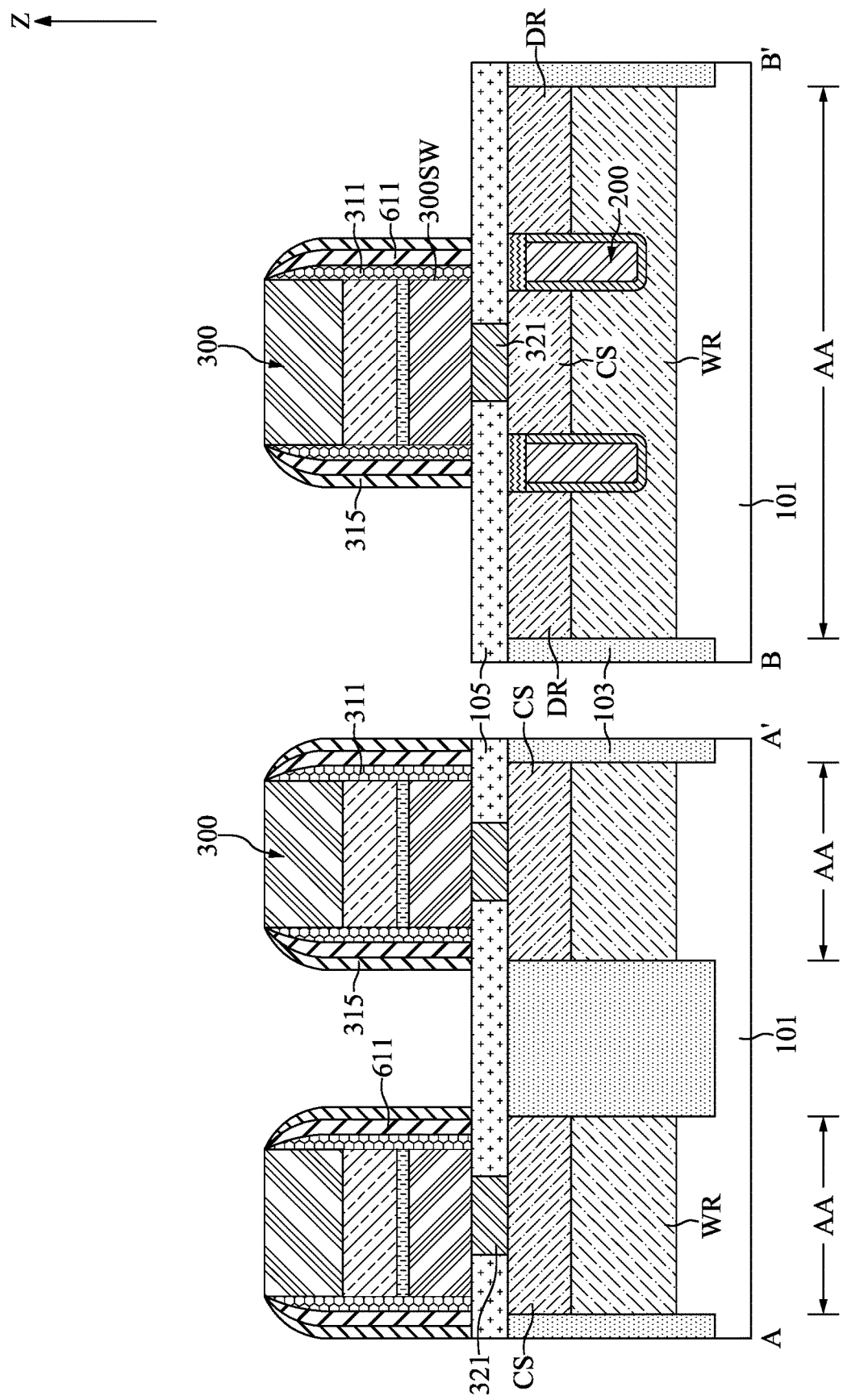

With reference to FIG. 34, a plurality of third bit line spacers 315 may be formed on the plurality of sacrificial spacers 611, respectively and correspondingly. The plurality of third bit line spacers 315 may be formed of, for example, undoped oxide or silicon nitride.

Figure 35:
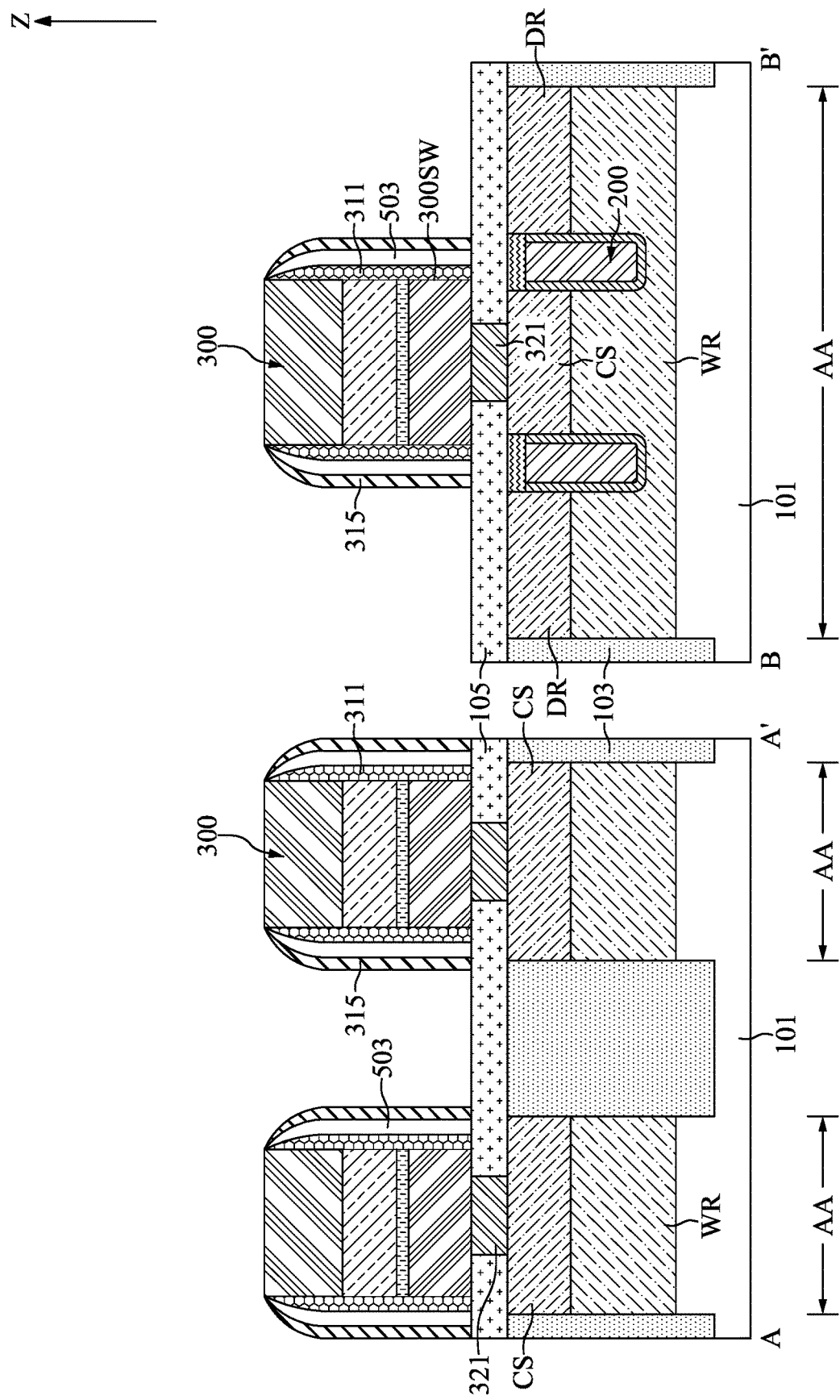

With reference to FIG. 35, a removal process may be performed to remove the plurality of sacrificial spacers 611 and form (or creating) the plurality of second air gaps 503, respectively and correspondingly. For brevity, clarity, and convenience of description, only one second air gap 503 is described. The second air gap 503 may be formed between the first bit line spacer 311 and the third bit line spacer 315. In some embodiments, the second air gap 503 may have a line-shaped cross-sectional profile in a top-view perspective (not shown).

In some embodiments, the removal process may involve a vapor etching. For instance, vapor hydrogen fluoride can be used to remove the plurality of sacrificial spacers 611, thereby forming the plurality of second air gaps 503 in situ. The vapor hydrogen fluoride exhibits a higher etching rate on the doped oxide sacrificial spacers 611 due to the density difference between them and the undoped oxide first bit line spacers 311 and third bit line spacers 315. Consequently, the vapor hydrogen fluoride selectively removes the doped oxide sacrificial spacers 611 while leaving the undoped oxide first bit line spacers 311 and third bit line spacers 315 intact.

In some embodiments, the removal process may involve a heating process. The intermediate semiconductor device illustrated in FIG. 25 may be heated to decompose or degrade the sacrificial spacers 611 formed of thermal decomposable polymer or thermal degradable polymer. A temperature of the heat process may be about 300° C. to about 450° C. In some embodiments, the temperature of the heat process may be about 350° C. to about 420° C.

Figure 36:
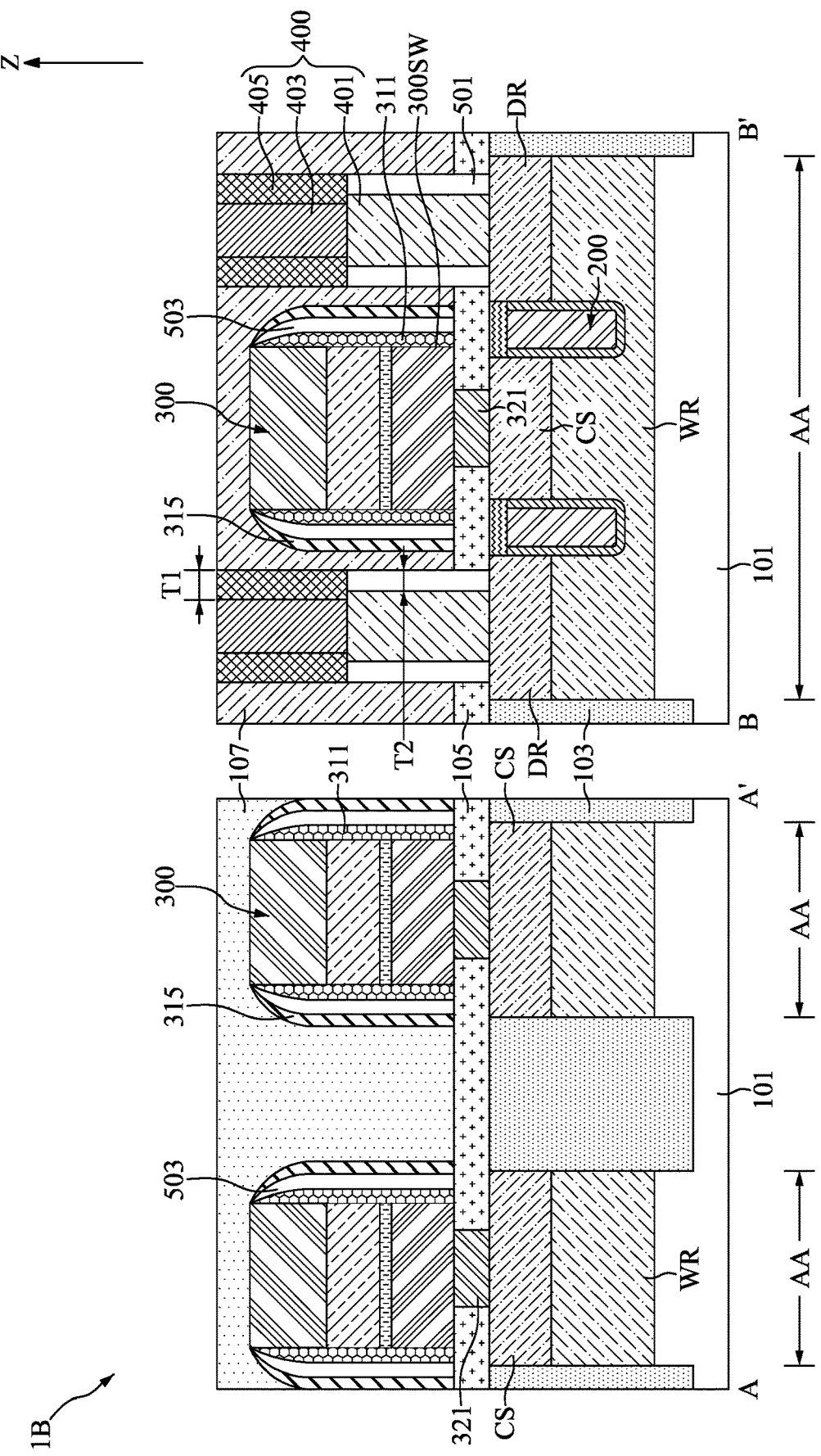

With reference to FIG. 36, the top dielectric layer 107, the plurality of first air gaps 501, and the plurality of cell contact structures 400 may be formed with a procedure similar to that illustrated in FIGS. 17 to 32, and descriptions thereof are not repeated herein.

Due to the presence of the plurality of second air gaps 503, the parasitic capacitance between conductive features (e.g., the plurality of bit line structures 300 and the plurality of cell contact structures 400) may be further reduced. As a result, the performance of the semiconductor device 1B may be further enhanced.

FIGS. 37 to 41 are schematic cross-sectional view diagrams illustrating part of a flow for fabricating a semiconductor device 1C in accordance with another embodiment of the present disclosure.

Figure 37:
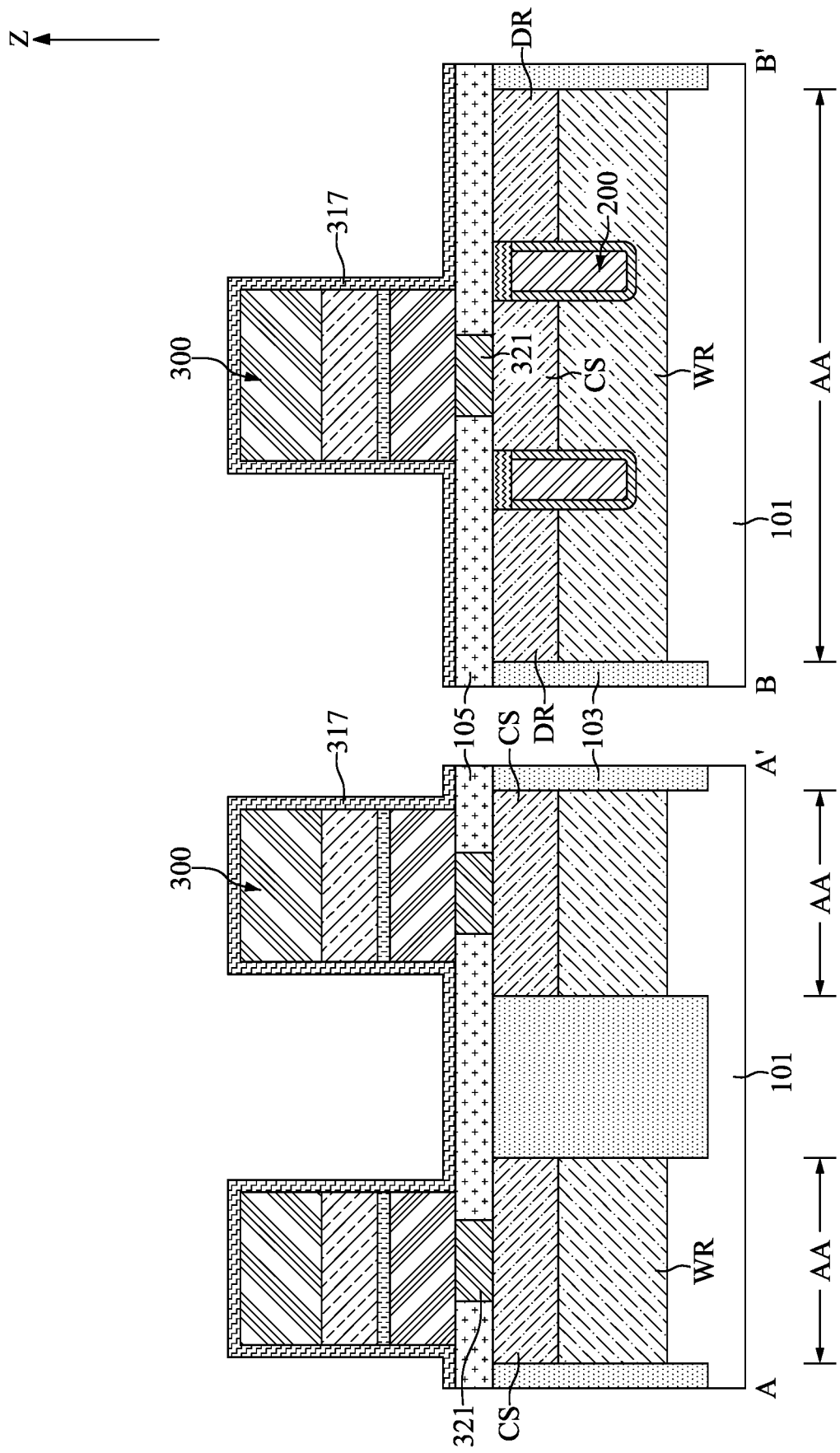
FIGS. 37 to 41 are schematic cross-sectional view diagrams illustrating part of a flow for fabricating a semiconductor device in accordance with another embodiment of the present disclosure.

With reference to FIG. 37, an intermediate semiconductor device may be fabricated with a procedure similar to that illustrated in FIGS. 2 to 14, and descriptions thereof are not repeated herein. A liner layer 317 may be conformally formed to cover the bottom dielectric layer 105 and the plurality of bit line structures 300. The liner layer 317 may be formed by, for example, atomic layer deposition, chemical vapor deposition, or other applicable deposition process. In some embodiments, the liner layer 317 may be formed of, for example, silicon nitride, silicon nitride oxide, silicon oxynitride, or other applicable dielectric materials.

Figure 38:
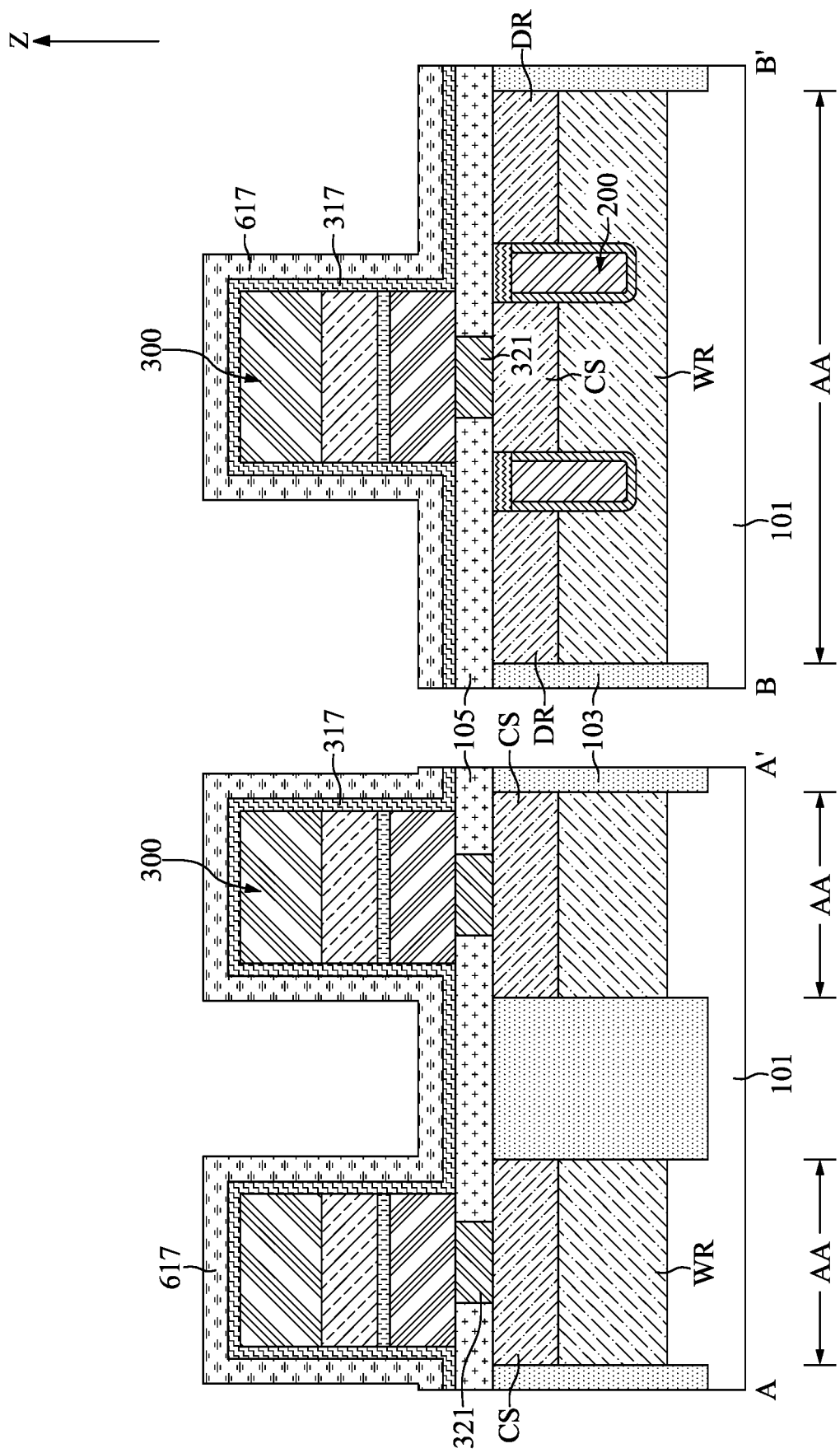

With reference to FIG. 38, a layer of spacer material 617 may be conformally formed on the liner layer 317. In some embodiments, the spacer material 617 may include vanadium and a low-k material. For example, the spacer material 617 may include one or more species of vanadium oxide. The species of vanadium oxide are according to $VO_x$, wherein x is in the range of about 1 to about 3. In some embodiments, the dielectric constant of the spacer material 617 may be between about 1 and about 3.

In some embodiments, the layer of spacer material 617 may be formed by, for example, chemical vapor deposition, plasma-enhanced chemical vapor deposition, atomic layer deposition, or plasma-enhanced atomic layer deposition. An atomic layer deposition process is theoretically self-limiting continuing until all available active sites on the substrate surface have been reacted. The atomic layer deposition process can be performed by time-domain or spatial atomic layer deposition.

In a time-domain process, the substrate (e.g., the liner layer 317) is exposed to a single reactive gas at any given time. In an exemplary time-domain process, the processing chamber might be filled with a metal precursor for a time to allow the metal precursor to fully react with the available sites on the substrate. The processing chamber can then be purged of the precursor before flowing a second reactive gas into the processing chamber and allowing the second reactive gas to fully react with the substrate surface or material on the substrate surface. The time-domain process minimizes the mixing of reactive gases by ensuring that only one reactive gas is present in the processing chamber at any given time. At the beginning of any reactive gas exposure, there is a delay in which the concentration of the reactive species goes from zero to the final predetermined pressure. Similarly, there is a delay in purging all of the reactive species from the process chamber.

In a spatial atomic layer deposition, the substrate is moved between different process regions within a single processing chamber. Each of the individual process regions is separated from adjacent process regions by a gas curtain. The gas curtain helps prevent mixing of the reactive gases to minimize any gas phase reactions. Movement of the substrate through the different process regions allows the substrate to be sequentially exposed to the different reactive gases while preventing gas phase reactions.

In some embodiments, precursors of vanadium may be any vanadium-organometallic compound. Suitable vanadium precursors include, but are not limited to, vanadium oxytri-isopropoxide, vanadium oxytriethoxide, vanadium acetylacetonate, vanadium oxytrichloride, vanadium (III) chloride, vanadium (IV) chloride, and the like. The vanadium precursors may be delivered by a carrier gas such as argon, helenium, or hydrogen. In some embodiments, the reactant may include an oxygen source, a nitrogen source, a carbon source, a hydrogen source, a boron source, a silicon source or combinations thereof.

In some embodiments, the layer of spacer material 617 may be doped. The layer of spacer material 617 may include dopants in an amount in the range of 0 to 50 atomic % of the layer. The dopants include but are not limited to, carbon, nitrogen, silicon, boron, and fluorine.

Figure 39:
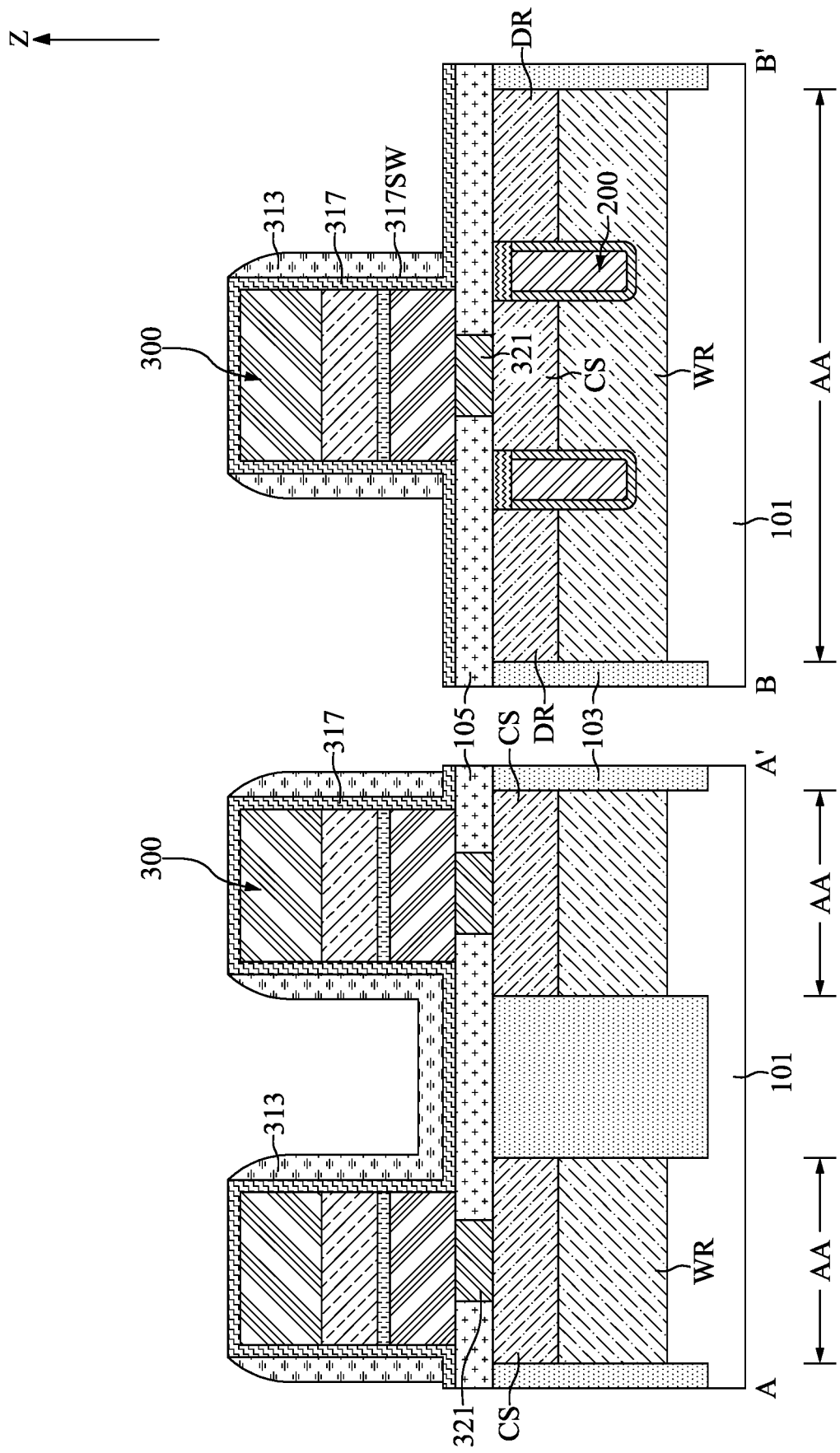

With reference to FIG. 39, a spacer etching process may be performed to remove portions of the spacer material 617. The remaining spacer material 617 may be referred to as the plurality of second bit line spacers 313 covering the sidewalls 317SW of the liner layer 317. The spacer etching process may be, for example, an anisotropic etching process such as reactive ion etching.

Figure 40:
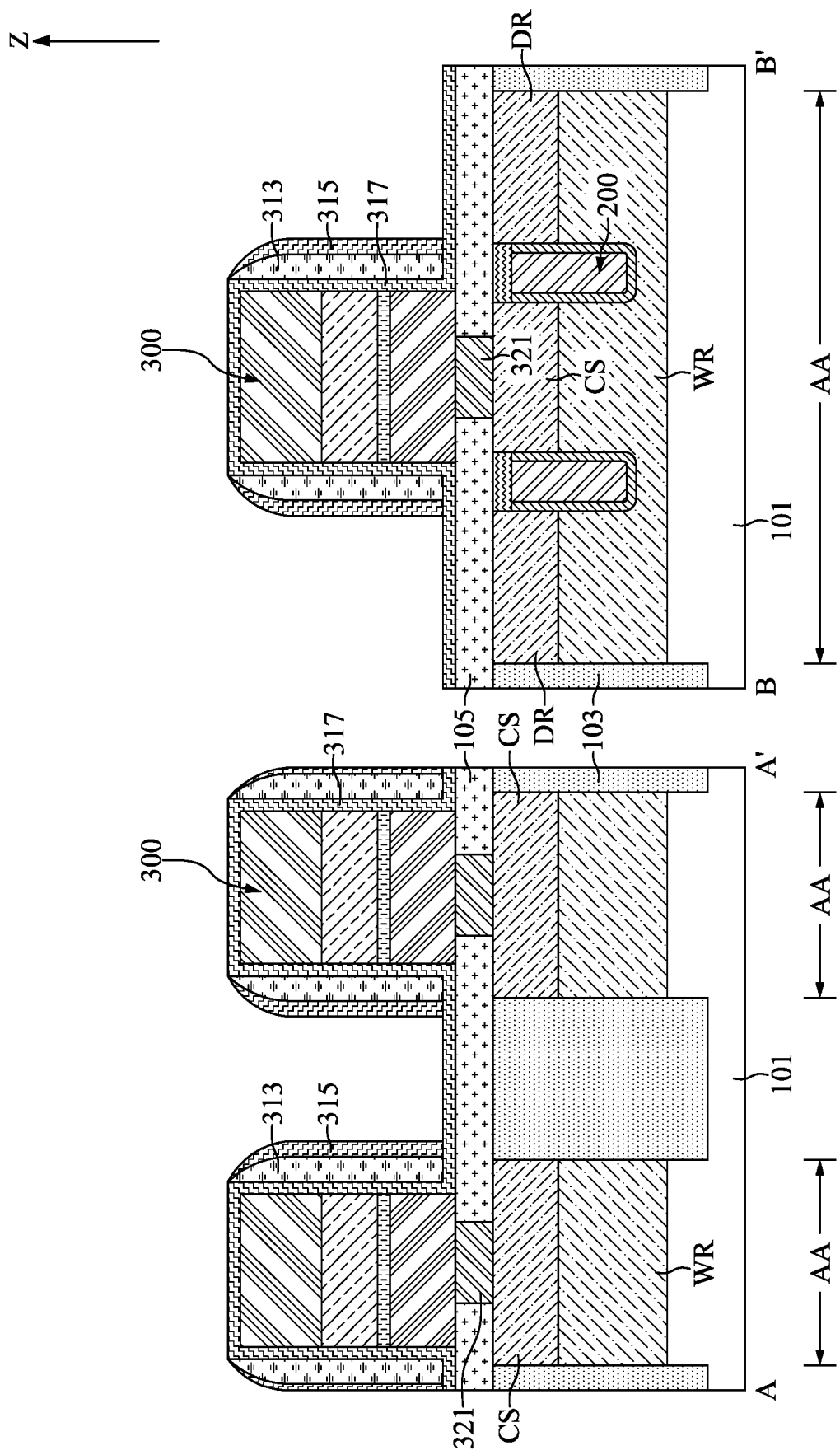

With reference to FIG. 40, a plurality of third bit line spacers 315 may be formed on the plurality of sacrificial spacers 611, respectively and correspondingly. The plurality of third bit line spacers 315 may be formed of, for example, undoped oxide or silicon nitride. In some embodiments, the plurality of third bit line spacers 315 may be formed of, for example, silicon oxide, silicon nitride, silicon oxynitride, silicon nitride oxide, or other applicable insulating material.

Figure 41:
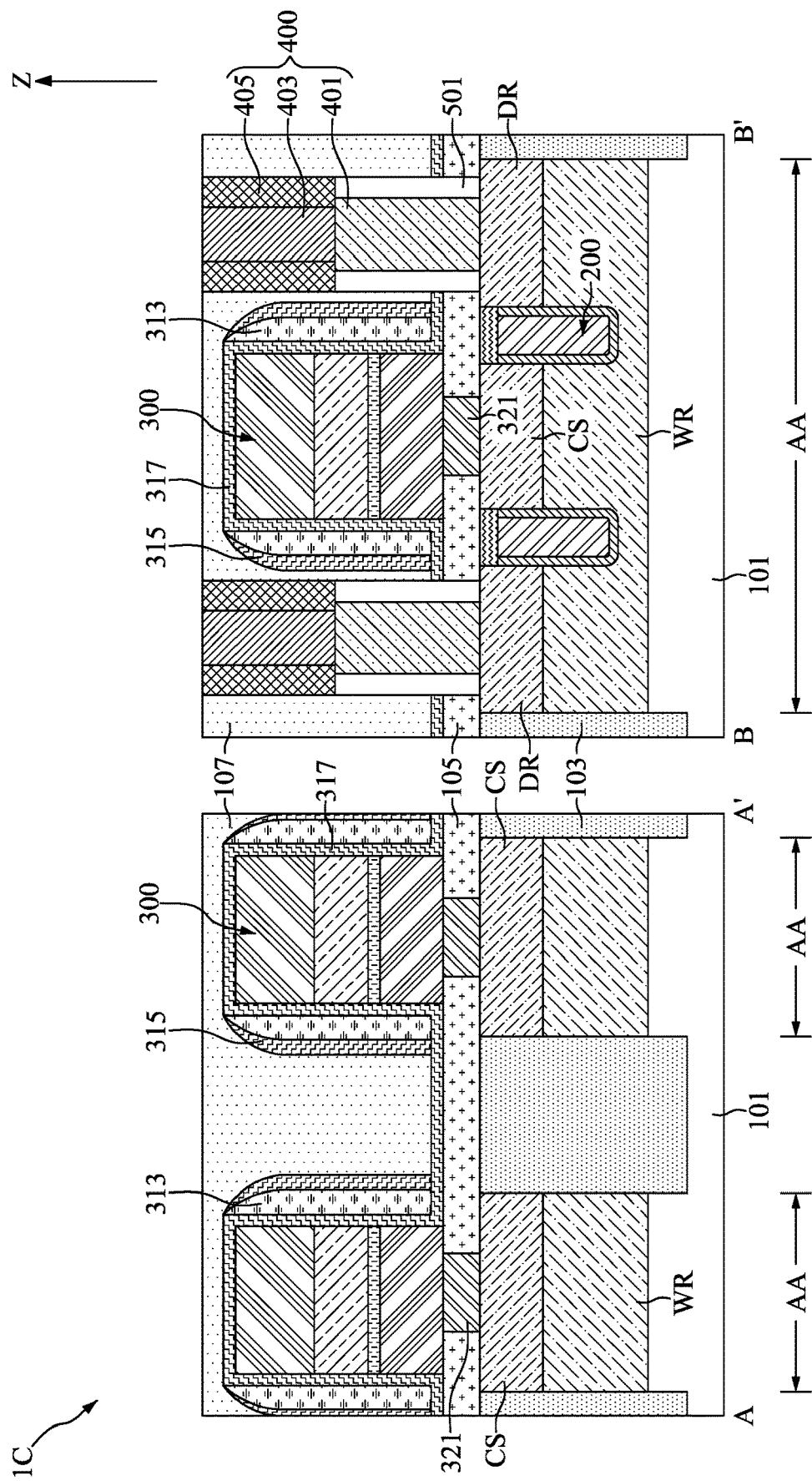

With reference to FIG. 41, the top dielectric layer 107, the plurality of first air gaps 501, and the plurality of cell contact structures 400 may be formed with a procedure similar to that illustrated in FIGS. 17 to 32, and descriptions thereof are not repeated herein.

Due to the employment of the plurality of second bit line spacers 313 containing vanadium, the parasitic capacitance between conductive features (e.g., the plurality of bit line structures 300 and the plurality of cell contact structures 400) may be further reduced. As a result, the performance of the semiconductor device 1C may be further enhanced.

One aspect of the present disclosure provides a semiconductor device including a substrate; a drain positioned in the substrate; a top dielectric layer positioned on the substrate; a cell contact structure including a cell contact bottom conductive layer positioned in the top dielectric layer and on the drain, a cell contact top conductive layer positioned in the top dielectric layer and on the cell contact bottom conductive layer, and a cell contact top sealing layer positioned in the top dielectric layer, on the cell contact bottom conductive layer, and surrounding the cell contact top conductive layer; and a first air gap positioned in the top dielectric layer and surrounding the cell contact bottom conductive layer.

Another aspect of the present disclosure provides a semiconductor device including a substrate; a common source and a drain positioned in the substrate and separated from each other by a word line structure; a top dielectric layer positioned on the substrate; a bit line structure positioned in the top dielectric layer and on the common source; a cell contact structure including a cell contact bottom conductive layer positioned in the top dielectric layer and on the drain, a cell contact top conductive layer positioned in the top dielectric layer and on the cell contact bottom conductive layer, and a cell contact top sealing layer positioned in the top dielectric layer, on the cell contact bottom conductive layer, and surrounding the cell contact top conductive layer; a first bit line spacer positioned on a sidewall of the bit line structure and between the cell contact structure and the bit line structure; a third bit line spacer positioned on the first bit line spacer; and a second air gap positioned between the first bit line spacer and the third bit line spacer.

Another aspect of the present disclosure provides a method for fabricating a semiconductor device including providing a substrate and forming a drain in the substrate; forming a top dielectric layer on the substrate and forming an opening along the top dielectric layer to expose the drain; conformally forming a sacrificial layer in the opening; performing a first punch etching process to partially remove the sacrificial layer, resulting in a sacrificial segment on a sidewall of the opening and exposing the drain; forming a cell contact bottom conductive layer on the drain and surrounded by the sacrificial segment; performing a removal process to remove the sacrificial segment and form a space surrounding the cell contact bottom conductive layer; forming a cell contact top sealing layer on the cell contact bottom conductive layer to seal the space, resulting in a first air gap surrounding the cell contact bottom conductive layer; and forming a cell contact top conductive layer on the cell contact bottom conductive layer and surrounded by the cell contact top sealing layer. The cell contact bottom conductive layer, the cell contact top conductive layer, and the cell contact top sealing layer configure a cell contact structure.

Due to the design of the semiconductor device in the present disclosure, the parasitic capacitance between conductive features may be reduced by utilizing the plurality of first air gaps 501. This reduction leads to an improvement in the performance of the semiconductor device 1A. Furthermore, the parasitic capacitance may be further reduced by incorporating the plurality of second air gaps 503 and/or the plurality of second bit line spacers 313, which contain vanadium. As a result, the performance of the semiconductor device 1A may be further enhanced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a drain positioned in the substrate;
a top dielectric layer positioned on the substrate;
a cell contact structure comprising:
a cell contact bottom conductive layer positioned in the top dielectric layer and on the drain;
a cell contact top conductive layer positioned in the top dielectric layer and on the cell contact bottom conductive layer; and
a cell contact top sealing layer positioned in the top dielectric layer, on the cell contact bottom conductive layer, and surrounding the cell contact top conductive layer; and
a first air gap positioned in the top dielectric layer and surrounding the cell contact bottom conductive layer;
wherein at least a portion of the drain is exposed from the first air gap;
wherein the first air gap is sealed by the top dielectric layer, the cell contact bottom conductive layer, and the cell contact top sealing layer.

2. The semiconductor device of claim 1, wherein the first air gap comprises a ring-shaped cross-sectional profile in a top-view perspective.

3. The semiconductor device of claim 2, wherein the cell contact top sealing layer comprises a ring-shaped cross-sectional profile in a top-view perspective.

4. The semiconductor device of claim 3, wherein a thickness of the cell contact top sealing layer is greater than a thickness of the first air gap.

5. The semiconductor device of claim 4, further comprising a bit line structure positioned on the substrate and adjacent to the cell contact structure.

6. The semiconductor device of claim 5, further comprising a first bit line spacer positioned on a sidewall of the bit line structure and positioned between the cell contact structure and the bit line structure.

7. The semiconductor device of claim 6, wherein the first bit line spacer comprises undoped oxide or silicon nitride.

8. The semiconductor device of claim 7, wherein the cell contact bottom conductive layer comprises polycrystalline silicon, polycrystalline germanium, polycrystalline silicon germanium, doped polycrystalline silicon, doped polycrystalline germanium, doped polycrystalline silicon germanium, or a combination thereof.

9. The semiconductor device of claim 8, wherein the cell contact top conductive layer comprises tungsten, cobalt, zirconium, tantalum, titanium, aluminum, ruthenium, copper, metal carbides, metal nitrides, transition metal aluminides, or a combination thereof.

10. The semiconductor device of claim 9, wherein the cell contact top sealing layer comprises silicon oxide or silicon nitride.

11. A semiconductor device, comprising:
a substrate;
a common source and a drain positioned in the substrate and separated from each other by a word line structure;
a bottom dielectric layer positioned on the substrate;
a top dielectric layer positioned above the bottom dielectric layer;
a bit line structure positioned in the top dielectric layer and on the common source;
a cell contact structure comprising:
a cell contact bottom conductive layer positioned in the top dielectric layer and on the drain;
a cell contact top conductive layer positioned in the top dielectric layer and on the cell contact bottom conductive layer; and
a cell contact top sealing layer positioned in the top dielectric layer, on the cell contact bottom conductive layer, and surrounding the cell contact top conductive layer;
a first bit line spacer positioned on a sidewall of the bit line structure and between the cell contact structure and the bit line structure;
a third bit line spacer positioned on the first bit line spacer; and
a second air gap positioned between the first bit line spacer and the third bit line spacer;
wherein the first bit line spacer and the second bit line spacer are formed on the bottom dielectric layer;
wherein the second air gap is sealed by the first bit line spacer, the third bit line spacer, and the bottom dielectric layer.

12. The semiconductor device of claim 11, wherein the first air gap comprises a ring-shaped cross-sectional profile in a top-view perspective.

13. The semiconductor device of claim 12, wherein the cell contact top sealing layer comprises a ring-shaped cross-sectional profile in a top-view perspective.

14. The semiconductor device of claim 13, wherein a thickness of the cell contact top sealing layer is greater than a thickness of the first air gap.

15. The semiconductor device of claim 14, further comprising a bit line contact positioned between the bit line structure and the common source.

16. The semiconductor device of claim 15, wherein the first bit line spacer comprises undoped oxide or silicon nitride.

17. The semiconductor device of claim 16, wherein the cell contact bottom conductive layer comprises polycrystalline silicon, polycrystalline germanium, polycrystalline silicon germanium, doped polycrystalline silicon, doped polycrystalline germanium, doped polycrystalline silicon germanium, or a combination thereof.

18. The semiconductor device of claim 17, wherein the cell contact top conductive layer comprises tungsten, cobalt, zirconium, tantalum, titanium, aluminum, ruthenium, copper, metal carbides, metal nitrides, transition metal aluminides, or a combination thereof.

19. The semiconductor device of claim 18, wherein the cell contact top sealing layer comprises silicon oxide or silicon nitride.

20. The semiconductor device of claim 19, wherein the third bit line spacer comprises undoped oxide or silicon nitride.

* * * * *